United States Patent
Rasheed et al.

(10) Patent No.: US 10,167,553 B2
(45) Date of Patent: Jan. 1, 2019

(54) APPARATUS AND METHOD FOR PROVIDING A UNIFORM FLOW OF GAS

(71) Applicant: Applied Materials, Inc., Santa Clara, CA (US)

(72) Inventors: Muhammad M. Rasheed, San Jose, CA (US); Ravi Jallepally, San Ramon, CA (US); Ilker Durukan, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/474,446

(22) Filed: Mar. 30, 2017

(65) Prior Publication Data

US 2017/0283947 A1 Oct. 5, 2017

Related U.S. Application Data

(60) Provisional application No. 62/317,433, filed on Apr. 1, 2016.

(51) Int. Cl.
| | | |
|---|---|---|
| *C23C 16/455* | (2006.01) | |
| *C23C 16/458* | (2006.01) | |
| *C23C 16/50* | (2006.01) | |
| *C23C 16/509* | (2006.01) | |

(52) U.S. Cl.
CPC .......... *C23C 16/458* (2013.01); *C23C 16/455* (2013.01); *C23C 16/45502* (2013.01); *C23C 16/45544* (2013.01); *C23C 16/45565* (2013.01); *C23C 16/50* (2013.01); *C23C 16/509* (2013.01)

(58) Field of Classification Search
CPC ................ C23C 16/458; C23C 16/509; C23C 16/45565; C23C 16/45544; C23C 16/455; C23C 16/50; C23C 16/45502
USPC ......................... 118/715; 156/345.33, 345.34
See application file for complete search history.

(56) References Cited

U.S. PATENT DOCUMENTS

| | | | |
|---|---|---|---|
| 6,106,625 | A | 8/2000 | Koai et al. |
| 6,435,816 | B1 | 8/2002 | Czachor |
| 2008/0268171 | A1 | 10/2008 | Ma et al. |
| 2009/0194024 | A1 | 8/2009 | Burrows et al. |
| 2013/0160946 | A1* | 6/2013 | Smargiassi ........ H01L 21/02203 156/345.5 |
| 2014/0103145 | A1 | 4/2014 | White et al. |
| 2016/0056019 | A1 | 2/2016 | Choi et al. |
| 2017/0032931 | A1 | 2/2017 | Kamp et al. |

OTHER PUBLICATIONS

PCT International Search Report and Written Opinion in PCT/US2017/025045 dated Jul. 13, 2017, 10 pages.

* cited by examiner

*Primary Examiner* — Rudy Zervigon
(74) *Attorney, Agent, or Firm* — Servilla Whitney LLC

(57) ABSTRACT

Outer distribution rings and gas distribution apparatus with outer distribution rings to deliver a gas flow to a process region of a process chamber are described. The outer distribution rings include at least one plenum in fluid communication with a plurality of openings forming a plurality of trenches to allow gas to flow from the plenum through the openings and down an inner peripheral face of the outer distribution ring.

8 Claims, 27 Drawing Sheets

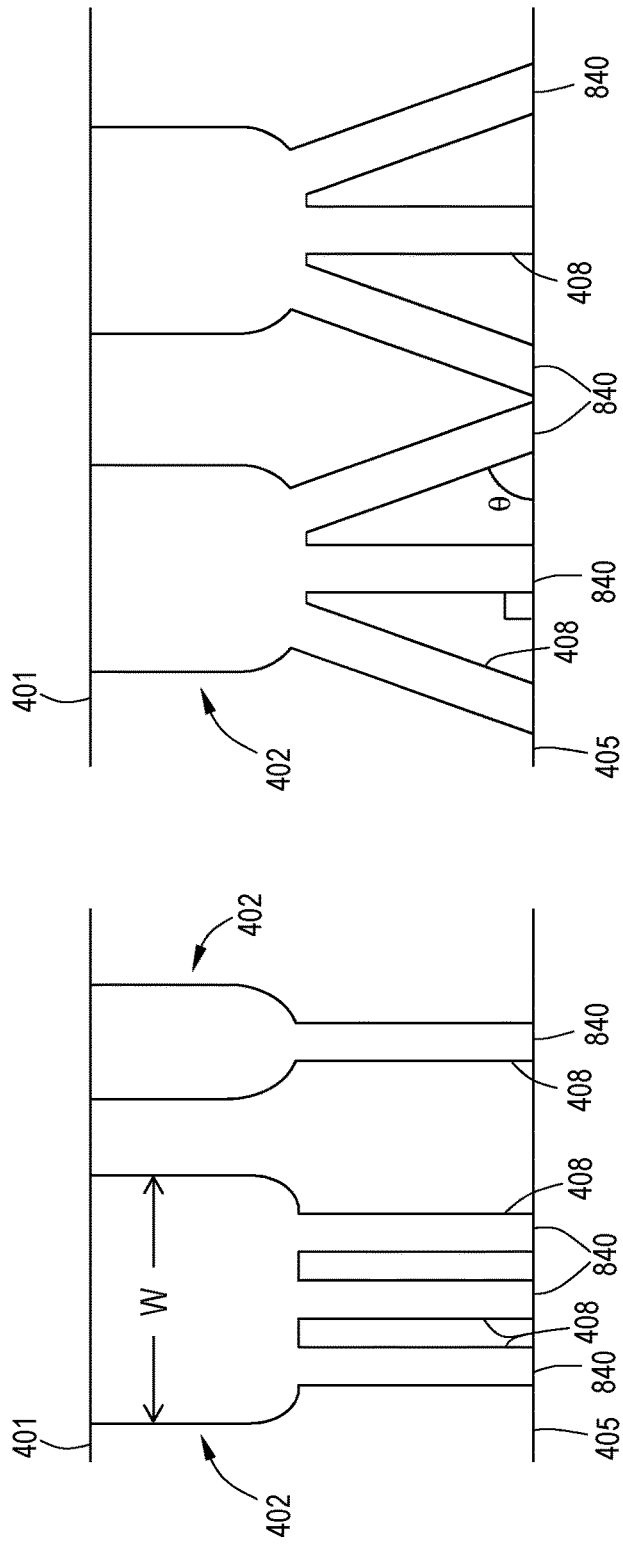

APPARATUS AND METHOD FOR PROVIDING A UNIFORM FLOW OF GAS

CROSS-REFERENCE TO RELATED APPLICATIONS

This application claims priority to U.S. Provisional Application No. 62/317,433, filed Apr. 1, 2016, the entire disclosure of which is hereby incorporated by reference herein.

FIELD

Embodiments of the disclosure generally relate to an apparatus and a method for flowing a gas into a processing chamber. More specifically, embodiments of the disclosure are directed to linear flow apparatus for directing a flow of gas to a processing chamber such as an atomic layer deposition chamber or chemical vapor deposition chamber.

BACKGROUND

In the field of semiconductor processing, flat-panel display processing or other electronic device processing, vapor deposition processes have played an important role in depositing materials on substrates. As the geometries of electronic devices continue to shrink and the density of devices continues to increase, the size and aspect ratio of the features are becoming more aggressive, e.g., feature sizes of 0.07 µm and aspect ratios of 10 or greater. Accordingly, conformal deposition of materials to form these devices is becoming increasingly important.

During an atomic layer deposition (ALD) process, reactant gases are introduced into a process chamber containing a substrate. Generally, a region of a substrate is contacted with a first reactant which is adsorbed onto the substrate surface. The substrate is then contacted with a second reactant which reacts with the first reactant to form a deposited material. A purge gas may be introduced between the deliveries of each reactant gas to ensure that the only reactions that occur are on the substrate surface.

Some processes use multiple gases for various reasons. For example, a CVD process may mix two reactive gases in the process region of a process chamber while adding a third gas as a diluent or catalytic agent. Additionally, some processes may incorporate additional gases post-processing to treat the deposited film or clean the process chamber. Therefore, there is an ongoing need in the art for improved gas distribution apparatuses that can provide a uniform supply of separate gases to the processing chamber.

SUMMARY

One or more embodiments of the disclosure are directed to edge rings comprising a round body having a top, bottom, inner diameter with an inner diameter face and an outer diameter with an outer diameter face. A plenum is formed in the top of the round body. The plenum has an outer peripheral face and an inner peripheral face defining a width. A plurality of openings is in the inner peripheral face of the plenum. The plurality of openings forms a plurality of trenches connecting the plenum with the inner diameter face. The plurality of trenches are substantially equally spaced about the inner peripheral face.

Additional embodiments of the disclosure are directed to gas distribution apparatus comprising a gas distribution plate and an edge ring. The gas distribution plate has an outer peripheral edge, a front side and a back side with at least one delivery channel recessed in the back side of a gas distribution plate. The delivery channel has an inlet end, an outlet end and a length. The delivery channel includes a plurality of apertures spaced along the length extending through the gas distribution plate to the front side of the gas distribution plate. The edge ring is around the outer peripheral edge of the gas distribution plate. The edge ring comprises a round body having a top, bottom, inner diameter with an inner diameter face and an outer diameter with an outer diameter face. The edge ring is positioned so that there is a gap between the outer peripheral edge of the gas distribution plate and the inner diameter face of the edge ring. A plenum is formed in the top of the round body. The plenum has an outer peripheral face and an inner peripheral face defining a width. At least one gas inlet is in fluid communication with the plenum. A plurality of openings are in the inner peripheral face of the plenum forming a plurality of trenches connecting the plenum with the gap between the inner diameter face and the outer peripheral edge of the gas distribution plate. The plurality of trenches are substantially equally spaced about the inner peripheral face.

Further embodiments of the disclosure are directed to processing chambers comprising a substrate support, a gas distribution apparatus and an edge ring. The substrate support has a top surface with a process region above the top surface. The gas distribution apparatus comprises a gas distribution plate having an outer peripheral edge, a front side defining a top of the process region and a back side with at least one delivery channel recessed in the back side of a gas distribution plate. The delivery channel has an inlet end, an outlet end and a length. The delivery channel includes a plurality of apertures spaced along the length extending through the gas distribution plate to the front side of the gas distribution plate. The edge ring is around the outer peripheral edge of the gas distribution plate. The edge ring comprises a round body having a top, bottom, inner diameter with an inner diameter face and an outer diameter with an outer diameter face. The edge ring is positioned so that there is a gap between the outer peripheral edge of the gas distribution plate and the inner diameter face of the edge ring. A plenum is formed in the top of the round body. The plenum has an outer peripheral face and an inner peripheral face defining a width. At least one gas inlet is in fluid communication with the plenum. A plurality of openings in the inner peripheral face of the plenum form a plurality of trenches connecting the plenum with the gap between the inner diameter face and the outer peripheral edge of the gas distribution plate. The plurality of trenches are substantially equally spaced about the inner peripheral face. The gap between the inner diameter face of the edge ring and the outer peripheral edge of the gas distribution plate is shaped to direct a gas to flow down the inner diameter face from the plurality of trenches out a front of the gas distribution apparatus in a direction substantially concentric with an axis of the body into an outer edge region of the process region. A supplemental gas inlet is in fluid communication with a supplemental gas line passing through the gas distribution apparatus to flow a supplemental gas into the process region. A confinement ring defines an outer edge of the process region and comprises a plurality of openings to allow a flow of gas to pass from the process region to exhaust.

BRIEF DESCRIPTION OF THE DRAWINGS

So that the manner in which the above recited features of the disclosure are attained and can be understood in detail, a more particular description of the disclosure, briefly summarized above, may be had by reference to the embodiments thereof which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 8B through 8G show partial cross-sectional views of a gas delivery channel and apertures in accordance with one or more embodiments of the disclosure;

DETAILED DESCRIPTION

Figure 1:
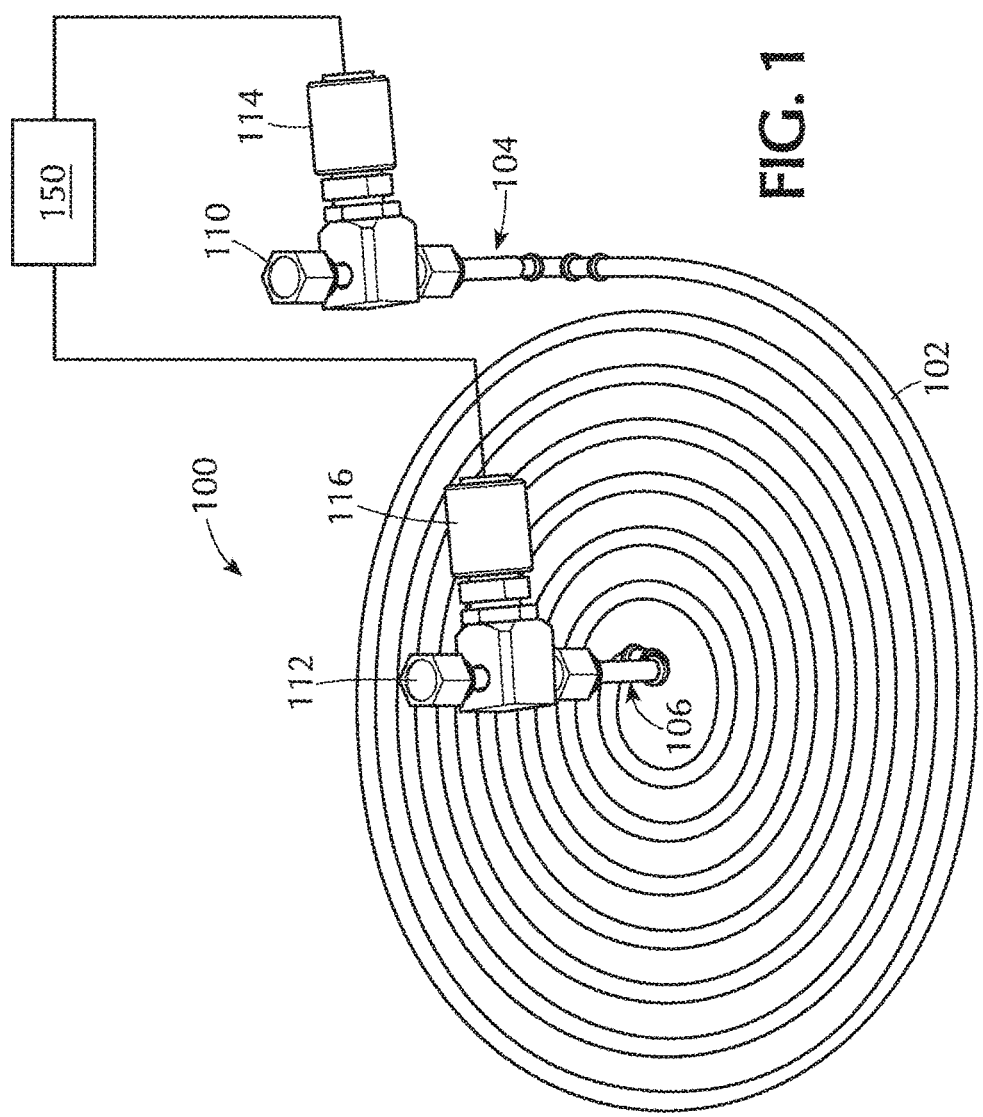
FIG. 1 shows a view of a gas distribution apparatus in accordance with one or more embodiments of the disclosure.

Embodiments of the disclosure are directed to gas distribution apparatus for use in chemical vapor deposition type processes. One or more embodiments of the disclosure are directed to atomic layer deposition processes and apparatus (also called cyclical deposition) incorporating the gas distribution apparatus described. The gas distribution apparatus described may be referred to as a showerhead or gas distribution plate, but it will be recognized by those skilled in the art that the apparatus does not need to be shaped like a showerhead or plate. The terms "showerhead" and "plate" should not be taken as limiting the scope of the disclosure.

A first embodiment of the disclosure is directed to an apparatus with a single spiral gas delivery channel. All gases flow sequentially through the same channel. An inlet is on the outer radial edge of the spiral, also referred to as the outer periphery, and may be attached to a gas source. A vacuum attachment is connected to the internal end of the spiral. The inlet and outlet can be reversed, either the gas source can be connected to the inside of the spiral with the outlet valve at the outside end of the spiral. The first embodiment can be used with a sequence as shown in Table 1.

TABLE 1

| Step | Gas Source | Outlet Valve |
| --- | --- | --- |
| 1 | Precursor A | Closed |
| 2a | Purge | Closed |
| 2b | Purge | Open |
| 2c | Purge | Closed |
| 3 | Precursor B | Closed |

A second embodiment has two spiral channels intertwined. Each channel has a gas inlet on the outer radial end of the spiral and an outlet valve on the inner radial end of each spiral. The inlet and outlet can be reversed or mixed. The different channels can be used for different precursors.

In a third set of embodiments, the channel is a linear gas line. The linear gas line can take any suitable shape, not just linear. There can be multiple linear gas lines for different precursors. Some embodiments have multiple parallel paths for all gases in sequence, where conductance of the gas channels are substantially the same.

In one or more embodiments, in an individual channel, conductance of the gas through the channel and through the apertures is controlled by modulating or changing the vacuum pressure at the outlet end. Changing the vacuum pressure in turn creates a unique flow dynamic that cannot be achieved in conventional gas distribution apparatus. In some embodiments, a more uniform gas flow is provided along the length of each channel and through the apertures spaced along the length of the channel. A uniform gas flow according to one or more embodiments means that there is substantially no dead space that inhibits flow or pumping of gasses through the channel. The provision of a vacuum with or without a valve on one end of the channel with a valve at the other end of the channel permits rapid switching between different types of gases, such as precursor or reactant gases.

In some embodiments, the vacuum at the end of the gas delivery channel enables the rapid purging of gases from within the channel. A purge gas source can be connected to the inlet of the gas delivery channel and work cooperatively with the vacuum at the outlet of the channel to even more rapidly remove the reactive gases from the channel. Additionally, vacuum ports can be spaced along the length of the gas delivery channel, not just at the end of the channel.

Embodiments of the disclosure may be capable of increasing the conductance of gas through the holes spaced along the gas delivery channel. Without being bound by any particular theory of operation, it is believed that controlling the vacuum pressure at the outlet end, or in the middle, of the channel changes the flow dynamics relative to a conventional showerhead or gas distribution plate.

Figure 2:
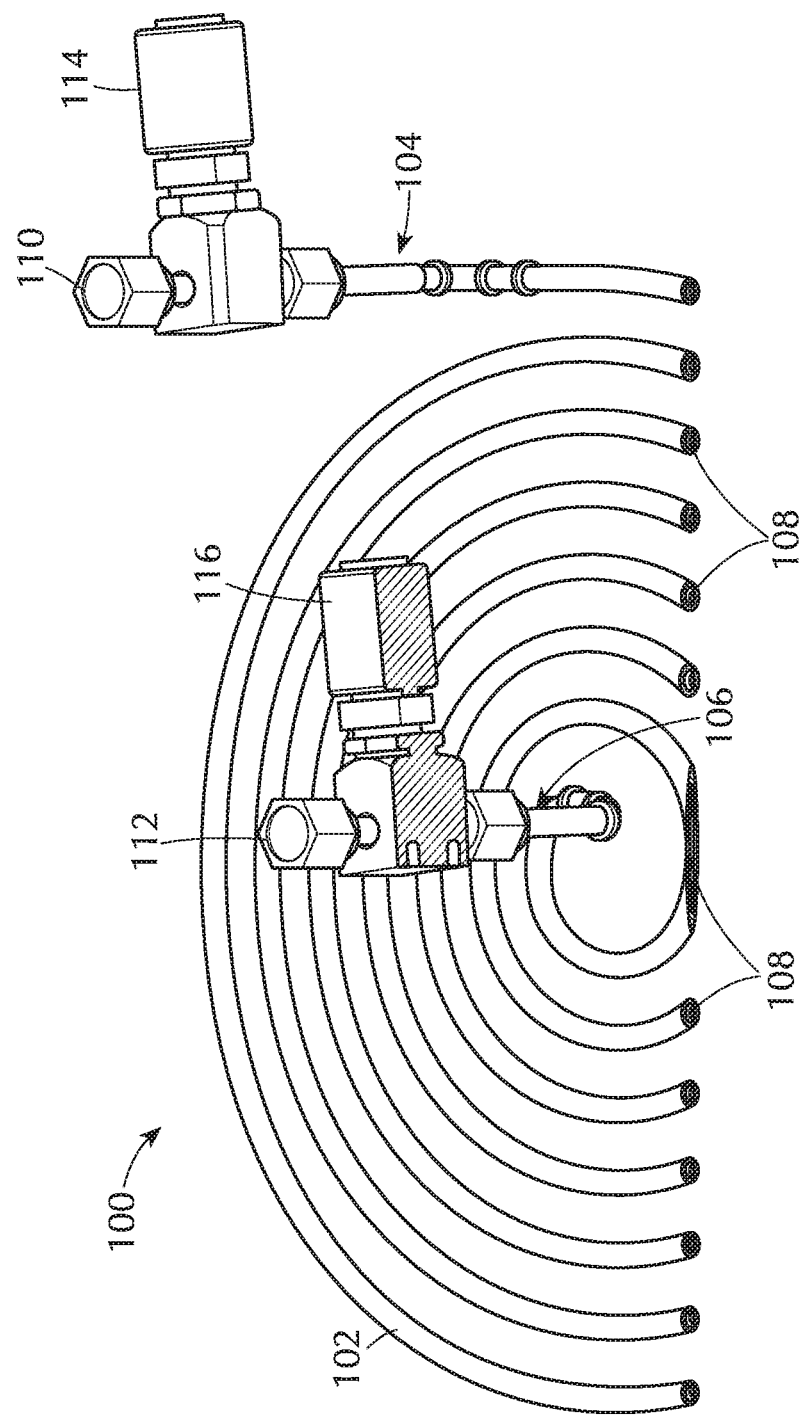
FIG. 2 shows a view of a gas distribution apparatus in accordance with one or more embodiments of the disclosure.

Referring to FIGS. 1 and 2, one or more embodiments are directed to gas distribution apparatus 100 to deliver a gas to a process chamber (not shown). The gas distribution apparatus 100 comprises a delivery channel 102 with an inlet end 104 and an outlet end 106. The delivery channel 102 has a plurality of apertures 108 spaced along the length of the delivery channel 102. An inlet 110 is connected to and in fluid communication with the inlet end 104 of the delivery channel 102. An outlet 112 is connected to and in fluid communication with the outlet end 106 of the delivery channel 102. The inlet 110 is adapted to be connected to a gas source and may include an inlet valve 114 capable of controlling the flow of gas into (or out of) the delivery channel 102 or completely cut off the flow of gas. The outlet 112 is adapted to be connected to a vacuum source and may include an outlet valve 116 capable of controlling the flow of gas into (or out of) the delivery channel 102 or completely cut off the flow of gas. The outlet 112 is connectable to a vacuum source (not shown) so that vacuum pressure through the outlet 112 is controllable by the outlet valve 116 to provide a reduced pressure at the outlet 112.

A controller 150 regulates the flow of the gas through the delivery channel 102 and into the process chamber. The controller 150 does this by opening or closing (or any point in between fully open and fully closed) the outlet valve during gas delivery and gas purging. This controls the flow of gas through apertures (seen, for example, in FIG. 4) spaced along the length of the channel.

The cross-sectional shape of the delivery channel 102 can be controlled such that gas flowing through the delivery channel experiences minimal resistance to flow. In some embodiments, the delivery channel 102 has a round or oval cross-sectional shape. In one or more embodiments, the delivery channel 102 has a cross-sectional shape sufficient such that bends, turns, twists, etc. provide substantially no dead space.

The overall shape (as opposed to the cross-sectional shape) of the delivery channel 102 can be modified as desired. For example, the delivery channel 102 can be shaped to fit within specific areas or to match the shape of a substrate. The delivery channel 102 can be, for example, straight, round, square, oval, rectangular or oblong. Additionally, the overall shape of the delivery channel can be made up of repeating units, which are parallel, perpendicular or concentric to each other. In one or more embodiments, the delivery channel has an overall shape in which there is substantially no dead space to inhibit gas flow or purging. As used in this specification and the appended claims, the term "substantially no dead space" means that the flow of gas, or purging, is inhibited by less than about 10% or by less than about 5% due to dead space.

In some embodiments, the delivery channel 102 is a tubular spiral having a substantially planar configuration. This particular shape is exemplified by the embodiment shown in FIGS. 1 and 2. As used in this specification and the appended claims, the term "substantially planar configuration" means that the plurality of apertures 108 in the delivery channel 102 are in mostly the same plane. The embodiment shown in FIGS. 1 and 2 has a substantially planar configuration because the apertures are coplanar, even though the inlet end and outlet end, and the portions of the delivery channel near the inlet end and outlet end are not coplanar with the plurality of apertures.

The delivery channel 102 can be used for plasma processing. For example, the delivery channel 102 can be polarized relative to another portion of the processing chamber to ignite a plasma within the chamber. The delivery channel 102 can be biased relative to a portion of the chamber, or a portion of the chamber can be biased relative to the delivery channel 102. For example, the delivery channel 102 can be polarized relative to the pedestal, or the pedestal can be polarized relative to the delivery channel. The frequency of the plasma can be tuned as well. In one or more embodiments, the plasma is at a frequency of about 13.56 MHz. In some embodiments, the plasma is at a frequency of about 40 MHz, 50 MHz, 60 MHz, 70 MHz, 80 MHz, 90 MHz, 100 MHz, 110 MHz or 120 MHz.

Any suitable material can be used for the delivery channel, showerhead or gas distribution apparatus. Suitable materials include, but are not limited to stainless steel and inert materials. In some embodiments, the delivery channel, showerhead or gas distribution plate is made of stainless steel.

Figure 3:
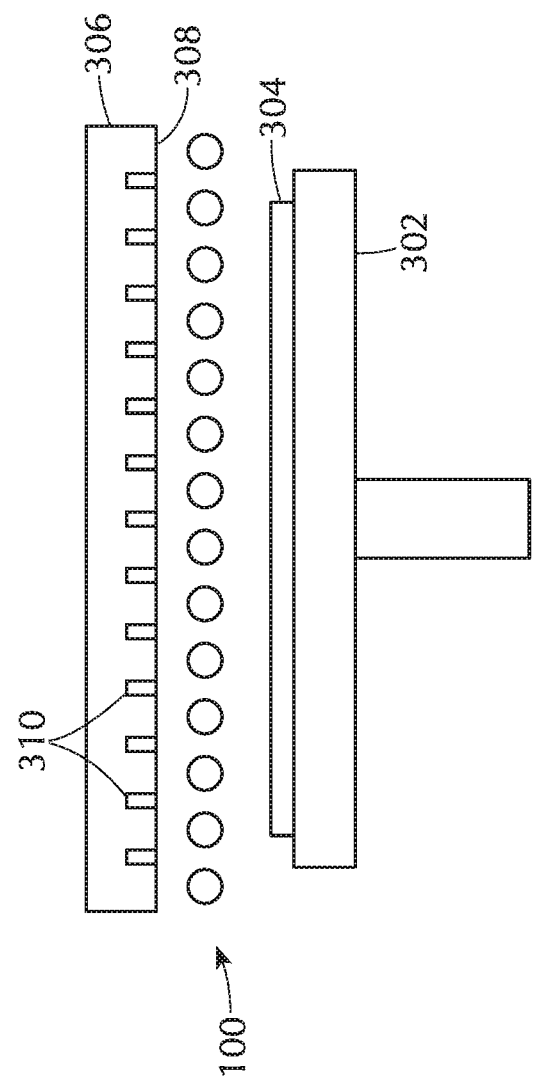
FIG. 3 shows a view of a processing chamber including one or more gas distribution apparatus in accordance with one or more embodiments of the disclosure.

FIG. 3 shows a cross-section of a portion of a processing chamber according to one or more embodiments. A gas distribution apparatus 100 is placed between a substrate support 302 and a gas distribution plate 306. The substrate support 302 is shown supporting a substrate 304. The substrate support 302 can be stationary or rotating, or can be stationary for part of the processing and rotating for part of the processing. A rotating substrate support 302 may allow for more uniform processing of a substrate by minimizing different gas flow patterns that may occur throughout the processing chamber. The substrate support 302 of some embodiments includes a heater or heating mechanism. The heater can be any suitable type of heater including resistive heaters.

The gas distribution apparatus 100 is shown as a tubular spiral with a substantially planar configuration. The substrate 304 can be processed with either, or both, the gas distribution plate 306 and the gas distribution apparatus 100. The gas distribution apparatus 100 can be shaped so that it does not substantially interfere with gas flowing from the gas distribution plate 306. As used in this specification and the appended claims, the term "substantially interfere" means that the gas distribution apparatus 100 does not interfere with more than about 30% of the gas flowing from the gas distribution plate. For example, the front surface 308 of the gas distribution plate 306 has a plurality of apertures 310 through which gases flow. The gas distribution apparatus 100 can be shaped to avoid blocking the apertures 310.

The delivery channel positioned like that of FIG. 3 can also be used for plasma processing. The apparatus 100 can be polarized relative to a portion of the chamber, or a portion of the chamber can be polarized relative to the apparatus 100. For example, the delivery channel apparatus 100 can be polarized relative to the substrate support 302, or the substrate support 302 can be polarized relative to the apparatus 100. In some embodiments, the apparatus 100 is polarized relative to the gas distribution plate 306. In one or more embodiments, the gas distribution plate 306 is polarized relative to the substrate support 302 and gas flowing from the apparatus 100 forms the plasma. The frequency of the plasma can be tuned as well. In one or more embodiments, the plasma is at a frequency of about 13.56 MHz. In some embodiments, the plasma is at a frequency of about 40 MHz, 50 MHz, 60 MHz, 70 MHz, 80 MHz, 90 MHz, 100 MHz, 110 MHz or 120 MHz.

FIGS. 4 through 7 show another embodiment of a gas distribution apparatus 400 in which the delivery channel 402 is a recessed channel in the back side 401 of a gas distribution plate 403. The embodiment shown has a large inner section recessed in the back side 401 of the gas distribution plate 403 with the delivery channel 402 recessed even further. This allows for the addition of a back cover 407 which can be placed in the recessed area in the back side 401 enclosing the delivery channel 402. The back cover 407, when inserted into the recessed back side 401 of certain embodiments creates a substantially flush back side surface of the gas distribution plate. It will be understood by those skilled in the art that the back cover 407 does not need to fit within a recessed area of the back side 401 of the gas distribution plate 403, but can also rest directly on the back side 401 of the gas distribution plate 403. In embodiments of this sort, there is no large recessed area with the delivery channels being further recessed. Instead, the delivery channels are recessed directly into the back side 401 of the gas distribution plate 403.

The back cover 407 may have openings to allow for the passage of inlet and outlet tubes to allow for fluid communication with the delivery channel 402. This can be seen in FIGS. 5 and 6. The inlet and outlet tubes can be an integral part of the back cover 407, or can be separate pieces connected to the back cover 407 in such a manner as to prevent or minimize fluid leakage. A plurality of apertures 408 extend through the gas distribution plate 403 to a front side 405 of the gas distribution plate 403. These apertures can be seen in FIGS. 4, 5 and 7. The plurality of apertures 408 can be evenly spaced along the length of the delivery channel, or can have varied spacing along the length of the channel. Variable spacing may help produce a more uniform gas flow from the delivery channel at points along the delivery channel. For example, in gas delivery channel that has an elaborate shape, the spacing of the apertures can varied along the length.

In the embodiment shown in FIGS. 4-7, the gas distribution plate 403 is round and the delivery channel 402 forms a spiral shape. The inlet end 404 is denoted at the outside of the spiral in an outer peripheral region 420 of the gas distribution plate 403 with the outlet end 406 at the center of the spiral in a central region 422 of the gas distribution plate 403. It will be understood by those skilled in the art that the inlet end 404 and outlet end 406 can be reversed with the inlet end 404 being located at the center of the spiral and the outlet end 406 at the outside of the spiral. In some embodiments, one of the inlet end 404 and outlet end 406 is positioned in an outer peripheral region 420 of the gas distribution plate 403 and the other of the inlet end 404 and outlet end 406 is positioned in a central region 422 of the gas distribution plate 403. In one or more embodiments, the inlet end 404 is positioned at the outer peripheral region 420 of the gas distribution plate 403 and the outlet end 406 is positioned at the central region 422 of the gas distribution plate 403. In certain embodiments, the outlet end 406 is positioned at the outer peripheral region 420 of the gas distribution plate 403 and the inlet end 404 is positioned at the central region 422 of the gas distribution plate 403.

Figure 5:
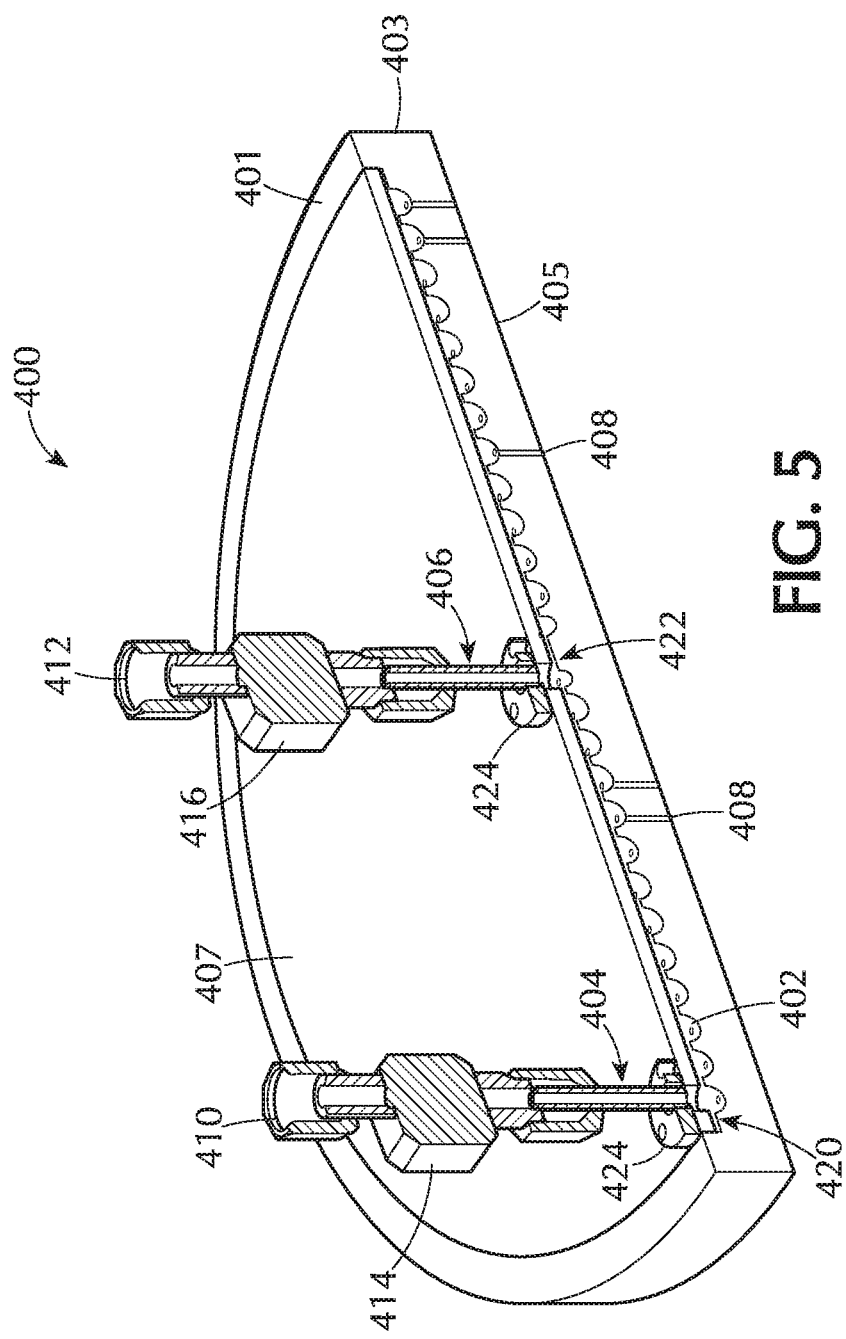
FIG. 5 shows a cross-section of a perspective view of a gas distribution apparatus in accordance with one or more embodiments of the disclosure
Figure 6:
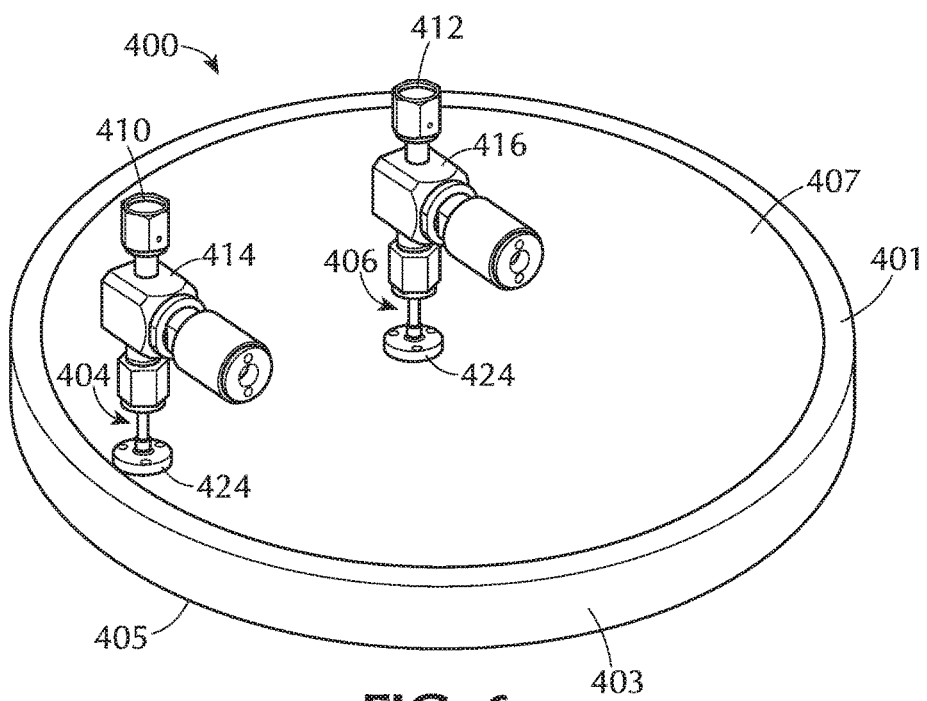
FIG. 6 shows a perspective view of a gas distribution apparatus in accordance with one or more embodiments of the disclosure.
Figure 7:
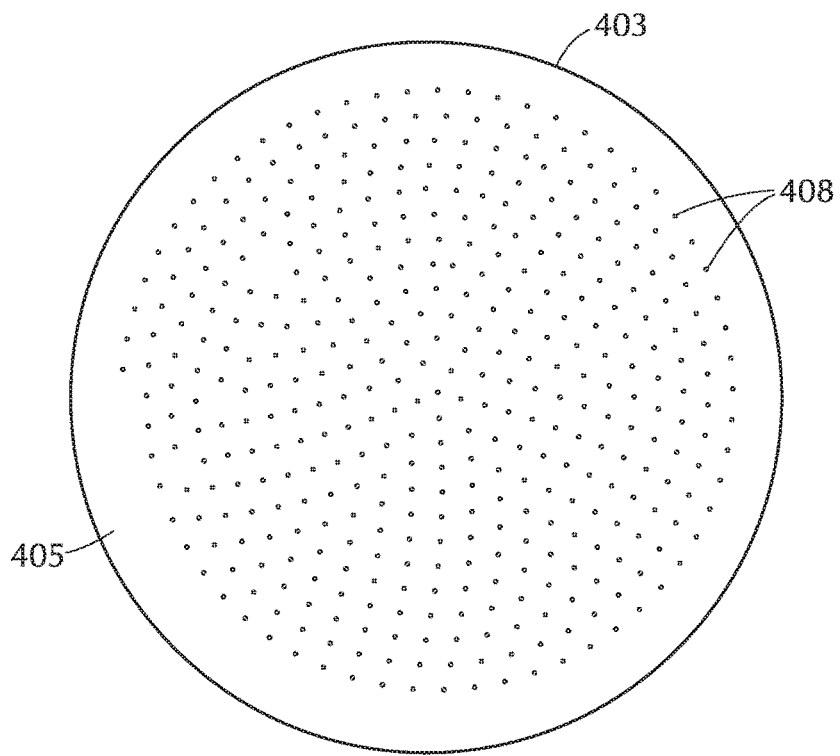
FIG. 7 shows a bottom view of a gas distribution apparatus in accordance with one or more embodiments of the disclosure.

In FIGS. 5 and 6, the inlet end 404 and outlet end 406 are illustrated as a small tube extending from the back cover 407 of the gas distribution plate 403. The tubes extend between the inlet 410 and the back cover 407 through an inlet valve 414. Another tube can extend between the outlet 412 and the back cover 407 through the outlet valve 416. The tubes can be connected to the back cover 407 by any suitable connection known to those skilled in the art and may be sealed to prevent leakage of fluid flowing through the tube into the delivery channel 402. Suitable sealing devices include, but are not limited to, o-rings positioned between a flange 424 and the back cover 407. The flange 424 can be integrally formed with the tube or can be a separate piece that holds the tube to the back cover. The flange 424 can be connected to the back cover 407 by any suitable mechanical connection, including but not limited to, screws.

Figure 8A:
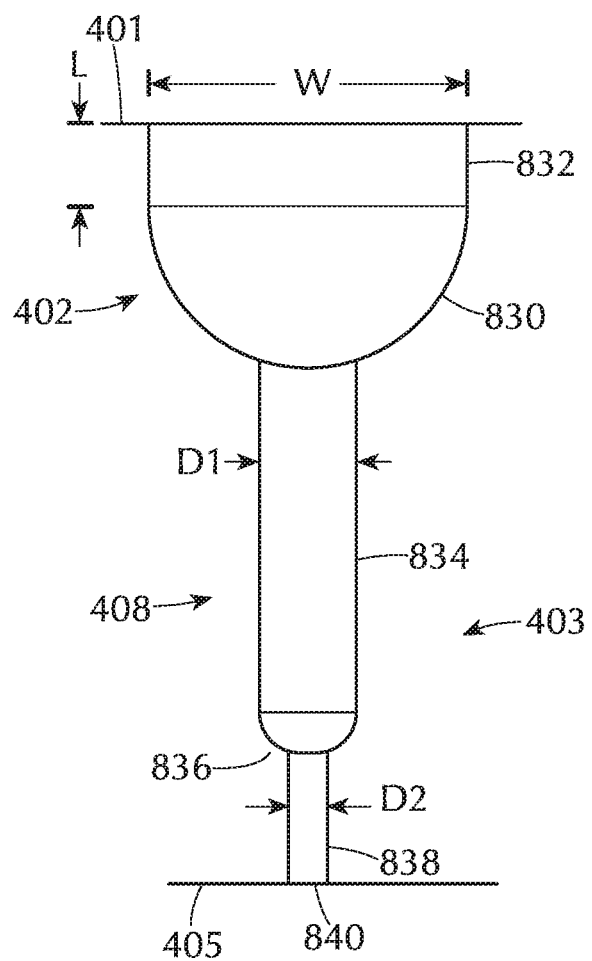
FIG. 8A shows a partial cross-sectional view of a gas distribution apparatus in accordance with one or more embodiments of the disclosure.

FIG. 8A shows a cross-sectional view of one portion of a delivery channel 402 and an aperture 408 in a gas distribution plate 403 in accordance with one or more embodiments of the disclosure. It will be understood by those skilled in the art that the delivery channel and apertures described in FIG. 8A are merely illustrative and should not be taken as limiting the scope of the disclosure. Those skilled in the art will understand that there are other ways of creating flow from the delivery channel 402 through the gas distribution plate 403. The delivery channel 402 shown in FIG. 8A has two portions, an upper portion 832 and a lower portion 830. While these portions are shown as separate areas, it will be understood that there can be a seamless transition between the upper portion 832 and the rounded lower portion 830.

Additionally, it will be understood that the upper portion 832 is optional and does not need to be included in the delivery channel 402. When there is no upper portion 832, the lower portion 830 is the only portion. Thus, the delivery channel can have any suitable shape. In some embodiments, the shape of the delivery channel is such that there is substantially no interference with the flow of gases through the channel.

The upper portion 832 can have any suitable shape. In the embodiment shown in FIG. 8A, the upper portion 832 has walls which extend normal to the surface of the back side 401 of the gas distribution plate 403. However, it will be understood that the upper portion 832 can have walls which are canted from square to the back side 401. The canting can provide a larger opening at the back side 401 of the gas distribution plate 403, tapering to a smaller opening. Additionally, the canting can provide a smaller opening at the back side 401, tapering to a larger opening. The length of the upper portion 832 can be modified as necessary.

In some embodiments, the upper portion has sides which are substantially perpendicular to the back side 401 of the gas distribution plate 403 and extend a length L below the surface of the back side 401 in the range of about 0.01 inch to about 0.3 inches. As used in this specification and the appended claims, the term "substantially perpendicular to" means that walls of the upper portion have an angle relative to the back side of the gas distribution plate in the range of about 85 degrees to about 95 degrees. In some embodiments, the upper portion extends below the surface of the back side to a length L in the range of about 0.02 inches to about 0.2 inches, or in the range of about 0.05 inches to about 0.15 inches, or in the range of about 0.08 inches to about 0.12 inches. In one or more embodiments, the upper portion extends below the surface of the back side to a length about 0.1 inches.

The rounded lower portion 830 can have any suitable cross-section including, but not limited to, half-round and half-elliptical. The width of the rounded lower portion, also referred to as the diameter of the rounded lower portion, can be modified as necessary. The width of the upper portion can be modified as necessary. The diameter of the delivery channel, in general, can have an impact of the number of loops in the spiral. In some embodiments, as shown in FIG. 8A, the width of the upper portion is about equal to the diameter of the lower portion. The delivery channel of various embodiments has a diameter in the range of about 0.3 inches to about 0.45 inches, or in the range of about 0.325 inches to about 0.425 inches, or in the range of about 0.35 inches to about 0.40 inches. In one or more embodiments, the delivery channel has a diameter of about 0.375 inches.

The specific shape of the apertures 408 can vary depending on the desired flow of gases through the apertures. In the embodiment of FIG. 8A, the aperture 408 has three distinct sections; a first section 834, a second section 836 and a third section 838. Again, the number of sections and the shape of the sections are merely illustrative of one embodiment and should not be taken as limiting the scope of the disclosure. The first section 834 extends from the rounded lower portion 830 of the delivery channel 402 toward the front side 405 of the gas distribution plate 403. The first section 834 has a first diameter D1. The second section 836 extends from the first section 834 toward the front side 405 and has a diameter which tapers from the first diameter D1 to a second diameter D2, which is generally smaller than the first diameter. The third section 838 extends from the end of the second section 836 and ends at the front side 405 of the gas distribution plate 403. At the intersection of the third section 838 and the front side 405, a hole 840 is formed. Gases flowing through the delivery channel 402 exit the gas distribution plate 403 through this hole 840 into the processing chamber. The hole 840 has about the same diameter as the second diameter D2. In various embodiments, the diameter of hole 840 is in the range of about 0.01 inches to about 0.25 inches, or in the range of about 0.02 inches to about 0.2 inches, or in the range of about 0.03 inches to about 0.15 inches or in the range of about 0.04 inches to about 0.1 inches. In some embodiments, the hold 840 has a diameter less than about 0.1 inches, or less than about 0.08 inches, or less than about 0.06 inches, or less than about 0.04 inches, or less than about 0.02 inches, or less than about 0.01 inch.

As the delivery channel spirals from the outer peripheral edge of the gas distribution plate to the central region, or vice versa, a seeming plurality of adjacent channels are observable in cross-section, even though it may be a single channel. FIG. 5 shows this seeming plurality of channels. The channels, or separation between loops of the spiral, are separated by a distance. In some embodiments, the distance between the channels, or the loops of the single channel, measured from centers, are in the range of about 0.375 inches to about 0.475 inches, or in the range of about 0.40 inches to about 0.45 inches, or in the range of about 0.41 inches to about 0.43 inches. In one or more embodiments, the average distance between centers of the adjacent channels is about 0.42 inches.

The length of the gas channel shown in FIGS. 4 to 7 can vary depending on a number of factors, including, but not limited to, the diameter of the channel and the distance between the adjacent channels. In various embodiments, the delivery channel has a length in the range of about 140 inches to about 340 inches, or in the range of about 180 inches to about 300 inches, or in the range of about 200 inches to about 280 inches, or in the range of about 220 inches to about 260 inches. In one or more embodiments, the delivery channel has a length of about 240 inches.

The number of apertures is also dependent on a variety of factors, including but not limited to, the length of the delivery channel and the spacing of the apertures. In some embodiments having a single spiral channel, there are in the range of about 300 and 900 apertures, or in the range of about 400 to about 800 apertures, or in the range of about 500 to about 700 apertures. In various embodiments, there are greater than about 300, 400, 500, 600, 700 or 800 apertures along the length of the channel. In one or more embodiments, there are about 600 apertures along the length of the delivery channel.

In some embodiments, each of the plurality of apertures 408 has an independent hole diameter and delivery angle relative to the front side 405 of the gas distribution plate. The plurality of apertures 403 may have one or more of (1) variable spacing along the length of the delivery channel; (2) variable hole diameters along the length of the delivery channel; and (3) variable delivery angles along the length of the channel.

In some embodiments, the spacing between apertures vary depending on the expected gas pressure in any particular region of the channel. For example, the gas pressure across the length of the channel will change due to, for example, the presence of apertures allowing gas to escape the channel. To counteract this pressure variability, there can be an increase or decrease in the density of apertures. The regions of the channel can be any length from the entire channel length to lengths less than the diameter of the apertures. For example, the first half of the channel length can have apertures spaced a first amount and the next quarter have apertures spaced closer together (i.e., a greater density of apertures) with the last quarter being even greater density. In some embodiments, the spacing of the plurality of apertures decreases along the length of the delivery channel from the inlet end to the outlet end. The decreasing spaces can be between each channel or between blocks of channels.

Figure 8E:
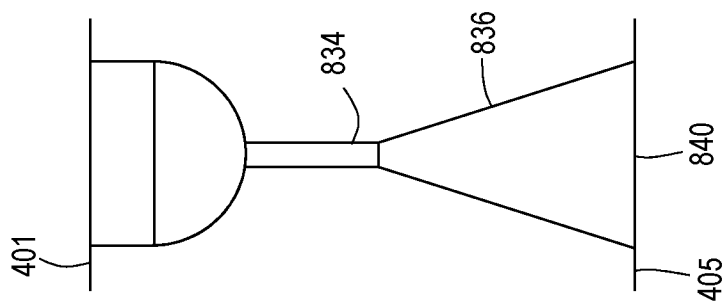
Figure 8D:
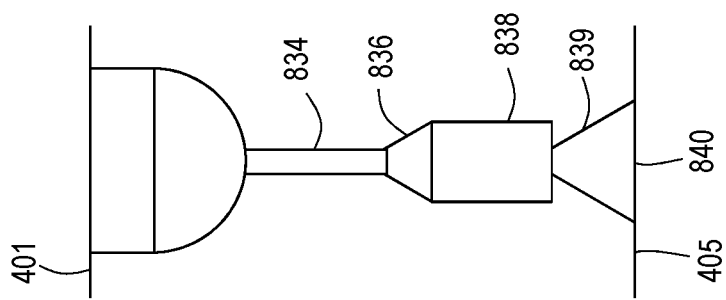
Figure 8C:
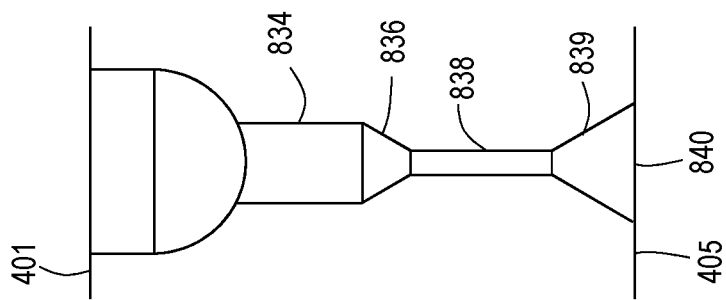
Figure 8B:
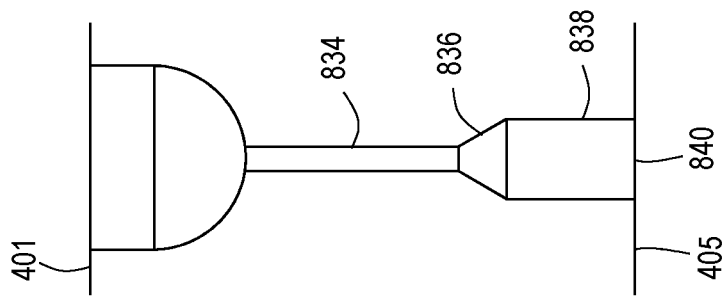
Figure 8H:
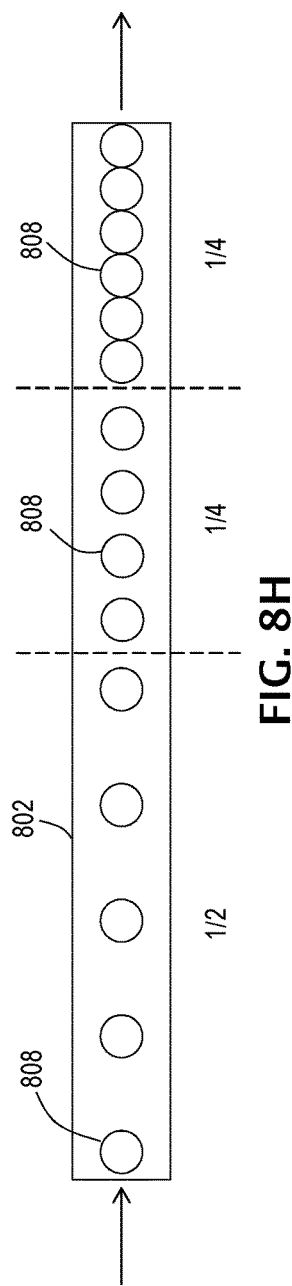
FIGS. 8H and 8I show examples of the spacing between apertures in a gas delivery channel in accordance with one or more embodiment of the disclosure.

For example, FIG. 8H shows a linear channel with three sections. A gas flowing from left-to-right would pass through the first section which takes ½ the channel length and then each of the next two sections which take about ¼ the length of the channel each. The spacing of the apertures 808 in the first section is larger than the spacing in the second section which is, in turn, larger than the spacing the last section. Here, the density of apertures changes in blocks or sections. The first section has the smallest density of (i.e., largest spacing between) apertures. The spacing between each of the apertures in the first section is the same. The spacing between each of the apertures in the second section are smaller than the first section. The spacing between each of the apertures in the second section is the same. The spacing between each of the apertures in the third section is the smallest with the spacing between each of these apertures the same.

Figure 8J:
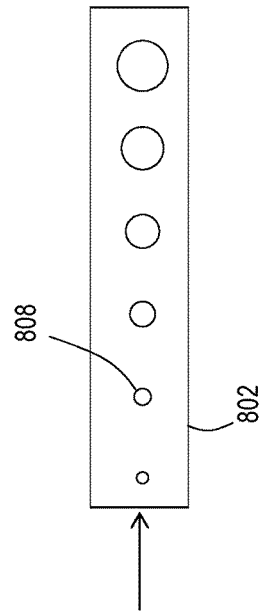
FIG. 8J shows an example of a gas delivery channel with varying aperture diameters in accordance with one or more embodiment of the disclosure.
Figure 8I:
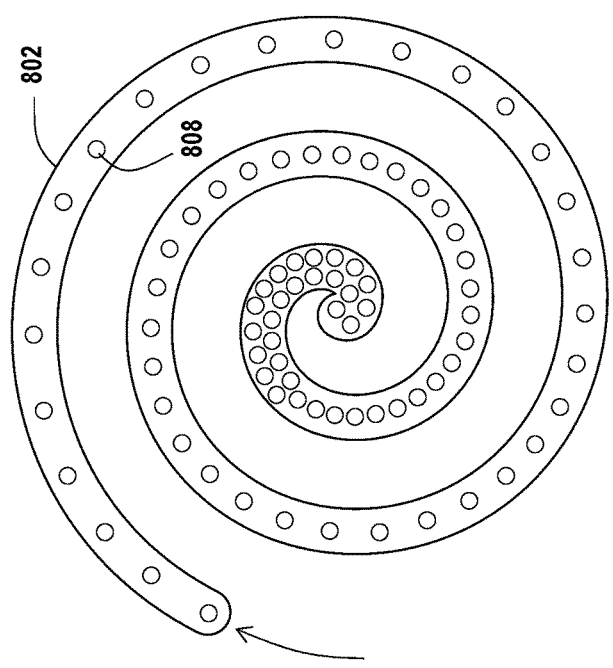

FIG. 8I shows an example of a spiral gas delivery channel 802 with gradually decreasing spaces between apertures 808. Here, the spacing between apertures is greatest at the inlet end with decreasing spacing toward the center of the spiral, which in this case, is the outlet end. It can also be seen that near the center of the spiral, the apertures are not only spaced close together along the length of the channel, but also spaced close together across the width of the spiral so that the apertures initially occur singly at any particular distance from the inlet end to multiple apertures at any particular distance from the inlet end.

In some embodiments, the diameter of the individual apertures can change along the length of the channel. As the gas pressure in the delivery channel decreases along the length of the channel, the diameter of the apertures can increase. FIG. 8J shows an example of a gas delivery channel 802 with gas flowing from left-to-right. The diameter of the apertures 808 gradually increase along the length of the channel with the largest diameter at the outlet end. The hole diameters are shown increasing gradually, but these could also change in blocks or segments, like the spacing described above.

The apertures can have any number of possible cross-sections. FIGS. 8A through 8G show a number of possible cross-sections. The apertures can be a single straight line that leads from the channel to the front side, or can have a number of sections. The number of sections and shapes can have an impact on the spray pattern of gases exiting the gas delivery channel through the apertures. In some embodiments, the apertures comprise a first section 834 having a first diameter and a second section 836 having a second diameter which is different from the first diameter. FIG. 8B shows an aperture 808 with a first section 834 adjacent the gas delivery channel and extending toward the front side 405. The second section 836 has a changing diameter which increases from the end closest the first section 834 toward the front side 405. Stated differently, the second diameter transitions from the first diameter to the second diameter. A third section 838 connects the second section 836 to the front side 405. The diameter of the third section 838 is the second diameter.

As shown in comparing FIGS. 8A and 8B, the first diameter can be larger than or smaller than the second diameter. In FIG. 8A, the first diameter is larger than the second diameter and in FIG. 8B, the reverse is the case.

FIGS. 8C and 8D show embodiments of the apertures which include a fourth section 839. In FIG. 8C, the first section 834 has a first diameter, the second section 836 transitions from the first diameter to a second diameter, the third section extends from the second section 836 toward the front side 405. A fourth section 839 extends from the third section 838 to the front side 405 with a varying size diameter. The fourth section 839 diameter increases from the second diameter to a third diameter at the front side 405 so that the hole 840 is larger than the second diameter. The third diameter can be the same as or different from the first diameter and is different from the second diameter. FIG. 8D shows a similar situation in which the first diameter and second diameter are reversed. The size of the hole 840 and the angle of the fourth section 839 can vary and may impact the gas spray pattern. FIG. 8E shows another embodiment in which there are two sections. The first section 834 extends from the gas delivery channel and has a first diameter. The second section 836 extends from the first section 834 to the front side 405 and has a diameter starting at the first diameter and transitioning gradually to the second diameter. While the second diameter shown is larger than the first diameter, it could also be smaller than the first diameter. The embodiments shown are merely exemplary and should not be taken as limiting the scope of the disclosure.

The width W of the gas delivery channels 402 and the pattern/number of apertures 408 across the width W of the gas delivery channels can also vary. FIG. 8F shows a cross-section of a portion of a gas distribution plate with two adjacent channels. The left channel has a width W much larger than the right channel. Additionally, the left channel has three separate apertures 408 extending in a line across the width of the channel. Stated differently, there are three apertures in the channel at the same distance from the inlet end. This means that the plurality of apertures extend along the length of the channel and may also extend along the wide of the channel. The two channels shown in FIG. 8F can be separate portions of the same channel (e.g., adjacent channels of a spiral shape). The diameter of the channel can increase or decrease along the length of the channel to change the gas flow pattern through the channel. The two channels shown in FIG. 8F can also be from separate channels with different gases flowing therethrough. For example, the gas flowing through the wider left channel may not be as reactive as the gas flowing through the narrower right channel, and the amount of the left gas exiting the channel is greater than the amount of the right gas. Again, these are merely examples of possible arrangements and should not be taken as limiting the scope of the disclosure. The gas distribution apparatus of claim 1, wherein some of the plurality of apertures comprise a plurality of passages forming a line extending across a width of the delivery channel.

In some embodiments, the individual apertures extend toward the front side 405 at varying angles from the gas delivery channel. The apertures can also have variable delivery angles relative to the front side of the gas distribution plate. FIG. 8G shows an embodiment of the disclosure in which there are two adjacent channels with three apertures extending across the width of each. The channels can be delivering the same gas or adjacent channels delivering different gases. Of the three channels, one extends straight down from the channel to make an angle about 90°, the side channels extend at an angle and make an angle θ relative to the front side of the gas distribution plate. The angle can be any suitable angle in the range of about 10° to about 90°. In one or more embodiments, the angle is in the range of about 20° to about 85°, or in the range of about 30° to about 80°, or in the range of about 40° to about 75°. In some embodiments, as can be extrapolated from the channels of FIG. 8G, at least some of the pluralities of apertures have delivery angles that direct a flow of gas toward a region under an adjacent delivery channel. This can help with uniformity of the deposition by minimizing striping caused by shape of the channel.

Figure 4:
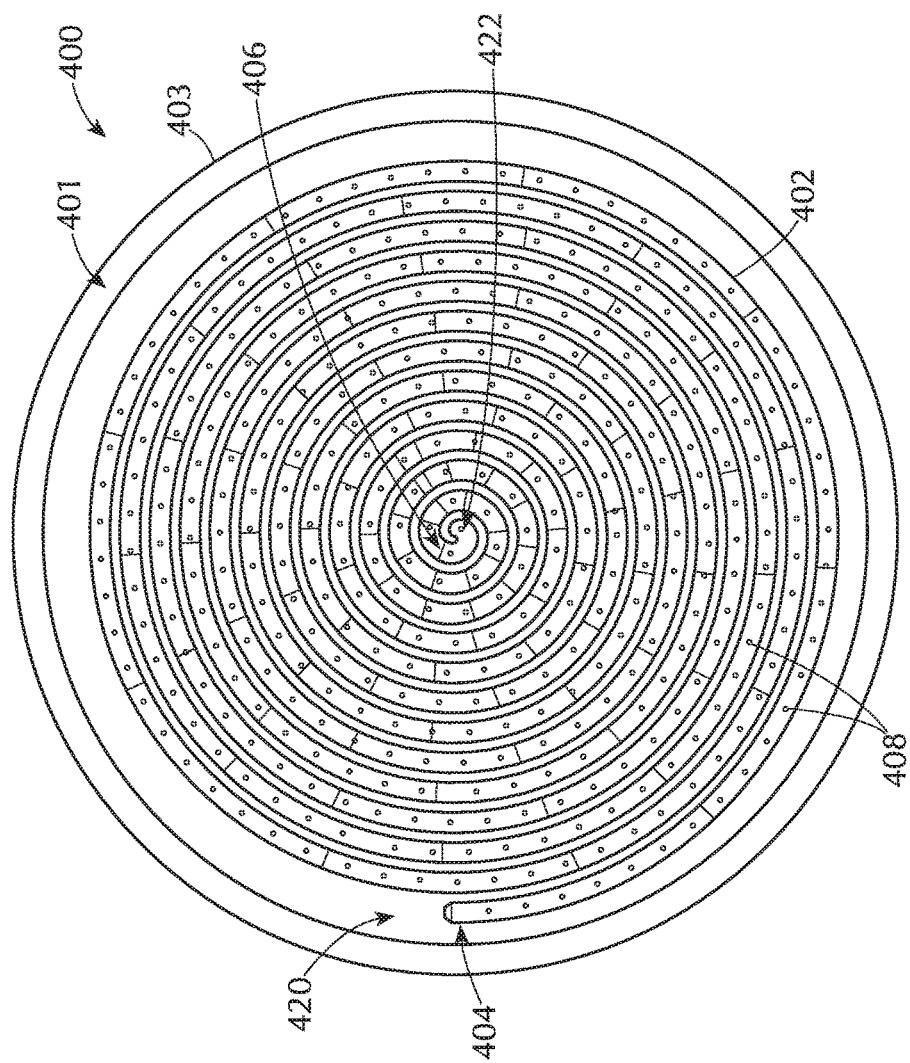
FIG. 4 shows a top view of a gas distribution apparatus in accordance with one or more embodiments of the disclosure.

In an embodiment, as shown in FIG. 4, the gas delivery plate 403 comprises a single delivery channel 402 in a back side of the gas delivery plate 403. The delivery channel 402 has an inlet end 404 located in an outer peripheral region 420 of the gas distribution plate 403. The delivery channel 402 follows an inward spiral path from the inlet end 404 to an outlet end 406 located in a central region 422 of the gas distribution plate 403. The delivery channel 402 has an overall length, defined as the distance between the inlet end 404 and the outlet end 406 of about 240 inches. A plurality of apertures 408 are spaced along the overall length of the delivery channel 402. Along the overall length of the delivery channel 402 there are in the range of about 500 apertures and about 700 apertures. The delivery channel 402 has an average diameter of about 0.375 inches and adjacent portions of the spiral channel are spaced about 0.42 inches on center.

Some embodiments of the disclosure include more than one delivery channel 402. These multiple channels can be intertwined or separate depending on the needs of the processing system. Some channels can be recessed into a gas distribution plate as shown in FIG. 4, or can be individual tubes as shown in FIG. 1. In some embodiments, there are a combination of individual tubes and recessed channels. An exemplary embodiment of the sort is shown in FIG. 3, where the gas distribution plate may have at least one recessed delivery channel therein and an additional delivery channel is positioned between the gas distribution plate and the substrate surface.

Figure 15:
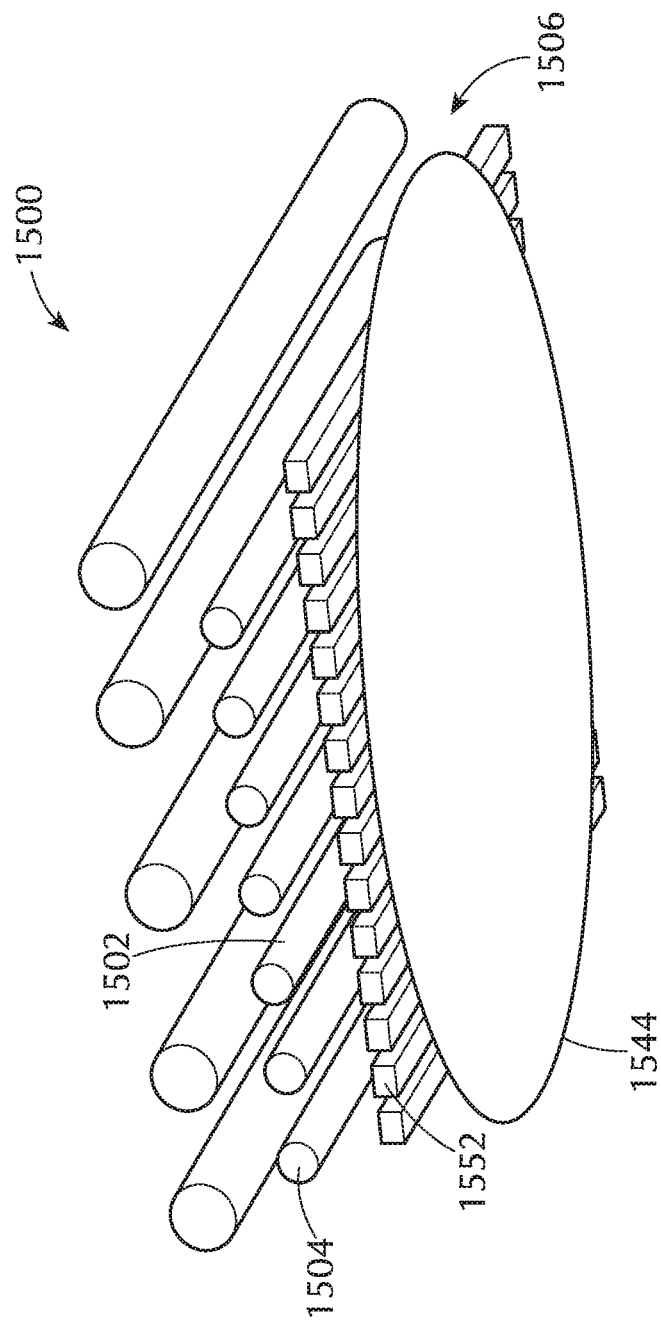
FIG. 15 shows a perspective view of a gas distribution apparatus in accordance with one or more embodiments of the disclosure.

Another embodiment of the disclosure is shown in FIGS. 9 through 14. A gas distribution apparatus 900 comprises two delivery channels 902a, 902b recessed in the back side 901 of a gas distribution plate 903. It will be understood that the delivery channels do not need to be recessed into the back of a gas distribution plate, but can be individual tubes, as shown in FIGS. 1 and 15. The first delivery channel 902a has a first inlet end 904a and a first outlet end 906a and a plurality of first apertures 1908a spaced along the length of the first delivery channel 902a. The second delivery channel 902b has a second inlet end 904b, a second outlet end 906b and a plurality of second apertures 1908b spaced along the length of the second delivery channel 902b.

A first inlet 910a is connected to the first inlet end 904a of the first delivery channel 902a. The first inlet 910a is adapted to be connected to a gas source. A first outlet 912a is connected to the first outlet end 906a of the first delivery channel 902a. The first outlet 912a is adapted to be connected to a vacuum source. A second inlet 910b is connected to the second inlet end 904b of the second delivery channel 902b. The second inlet 910b is adapted to be connected to a gas source. A second outlet 912b is connected to the second outlet end 906b of the second delivery channel 902b. The second outlet 912a is adapted to be connected to a vacuum source.

In the embodiment shown in FIGS. 9 to 14, each of the delivery channels 902a, 902b form a spiral shape. One or more embodiments, as that shown in the Figures, have the two delivery channels 902a, 902b intertwined along the length of the spiral shape. It will be understood by those skilled in the art that the two delivery channels 902a, 902b can have shapes other than spiral and do not need to intertwine. In certain embodiments, the plurality of first apertures 1908a and second apertures 1908b extend through the gas distribution plate 903 to the front side 905 of the gas distribution plate 903.

In some embodiments, each of the delivery channels 902a, 902b form a spiral shape with one of the inlet end 904a, 904b and outlet end 906a, 906b positioned in an outer peripheral region 920 of the gas distribution plate 903 and the other of the inlet end 904a, 904b and outlet end 906a, 906b positioned in a central region 922 of the gas distribution plate 903. In one or more embodiments, the inlet ends 904a, 904b of both channels 902a, 902b is positioned in the outer peripheral region 920 and the inlet ends 904a, 904b of both channels 902a, 902b are positioned in the central region 922 of the gas distribution plate 903. In certain embodiments, the inlet ends 904a, 904b of both channels 902a, 902b is positioned in the central region 922 and the inlet ends 904a, 904b of both channels 902a, 902b are positioned in the outer peripheral region 920 of the gas distribution plate 903. In one or more embodiments, one of the inlet ends 904a, 904b is positioned in the outer peripheral region 920 and the other inlet end 904b, 904a is positioned at the central region 922, with the outlet ends 906a, 906b at the other end of each individual delivery channel 902a, 902b.

Figure 10A:
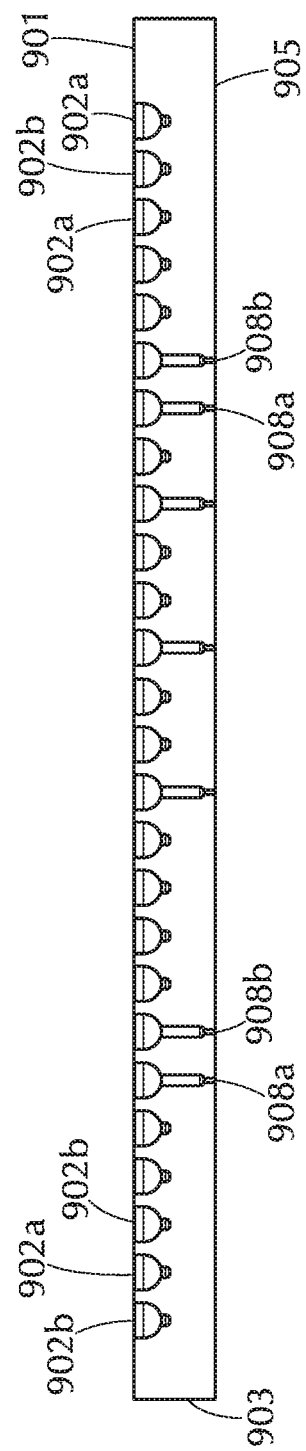
FIG. 10A shows a partial cross-sectional view of a gas distribution apparatus in accordance with one or more embodiments of the disclosure.

FIG. 10A shows a cross-sectional view of a gas distribution plate with two gas delivery channels. The shape, number, spacing and angles of the apertures can vary, as previously described. FIG. 10B shows a portion of an embodiment of a gas distribution plate with a first delivery channel 902a and a second delivery channel 902b. Both of these channels 902a, 902b, at least at the cross-section shown, have two apertures extending from the channel to the front side 905 of the gas distribution plate. The apertures shown are positioned at the outer edges of the channels so that the gases in the channels are very close to each other when exiting the apertures. The apertures between the first channel and the second channel can also be offset so that only one channel would have apertures visible in any given cross-section to prevent gas phase reactions.

Figure 10C:
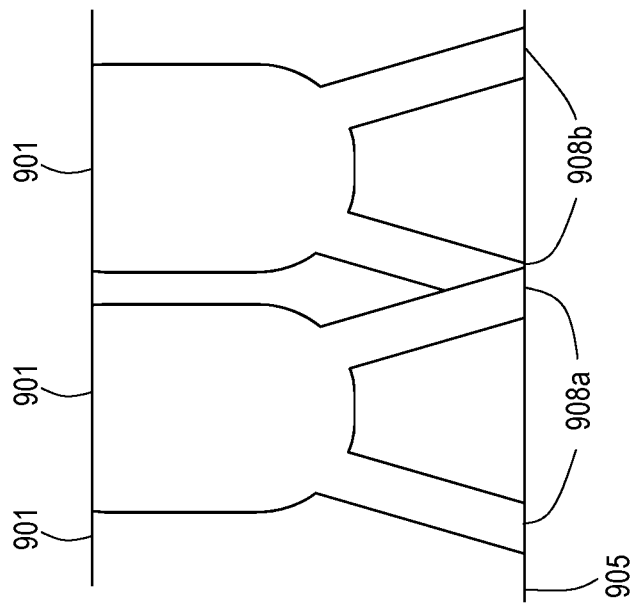
FIGS. 10B and 10C show partial cross-sectional views of gas delivery channels and apertures in accordance with one or more embodiments of the disclosure.
Figure 10B:
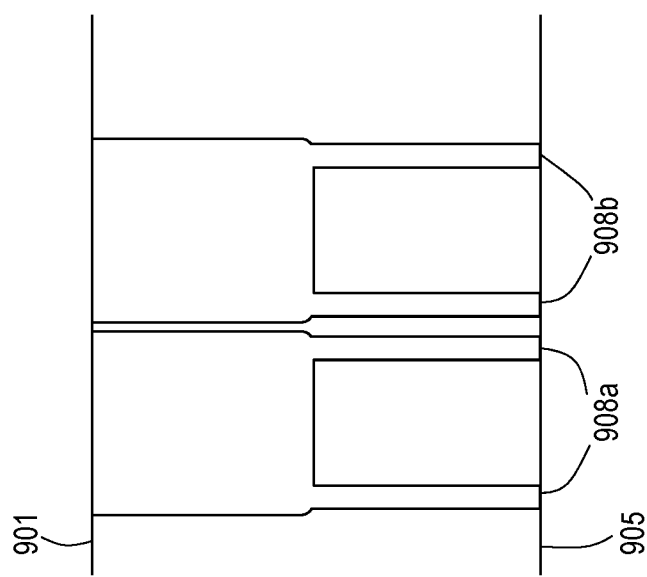

FIG. 10C shows another embodiment in which there are two gas channels with each channel having two apertures extending therefrom to form a delivery angle at the front side 905. Here, neither channel is shown with an aperture that expels gas directly below that aperture, but instead directs gases to the region beneath an adjacent channel. The first delivery channel 902a has an aperture that directs gas beneath the second delivery channel 902b and the second delivery channel 902b has an aperture that directs gas beneath the first delivery channel 902a. These apertures are shown to form holes at the same point on the front side, but it will be understood that these can be staggered along the length of the channel or that the cross-section shown for each channel can be from a different length from the inlets.

Figure 10D:
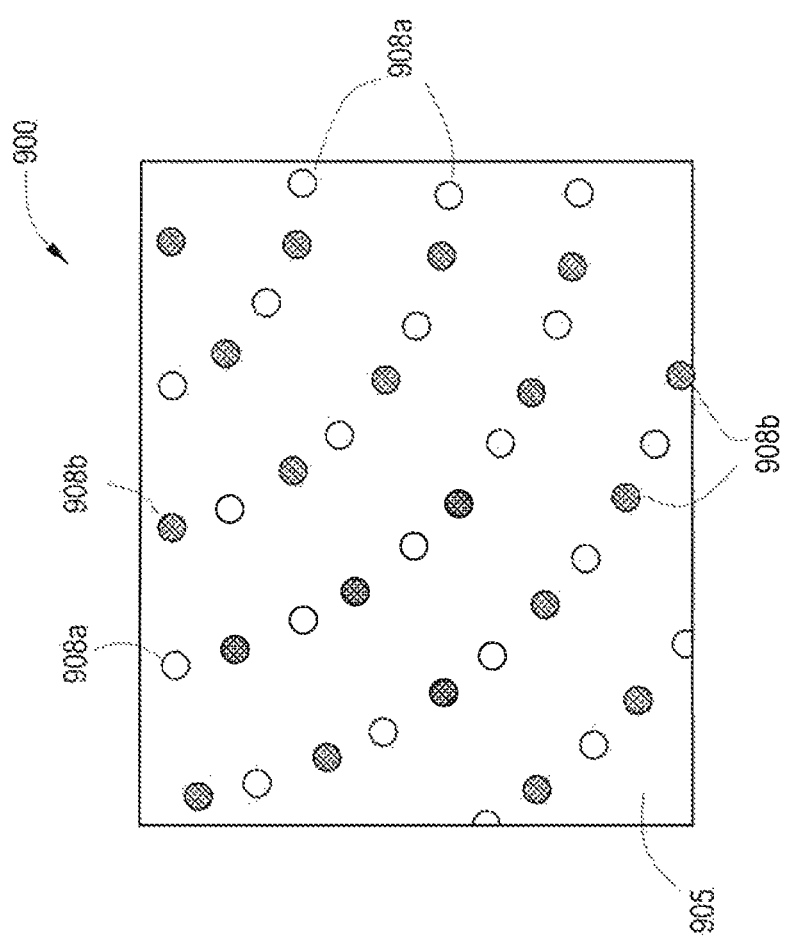
FIG. 10D shows a front view of a gas distribution apparatus in accordance with one or more embodiment of the disclosure.

The embodiment of FIG. 10C may be particularly effective at preventing deposition striping from the placement and orientation of the gases. FIG. 10D shows the surface of a portion of a gas distribution plate in which the channels have apertures like that of FIG. 10C which have offset cross-sections. The pattern of holes on the front side 905 presents an approximately alternating pattern of holes.

Figure 9:
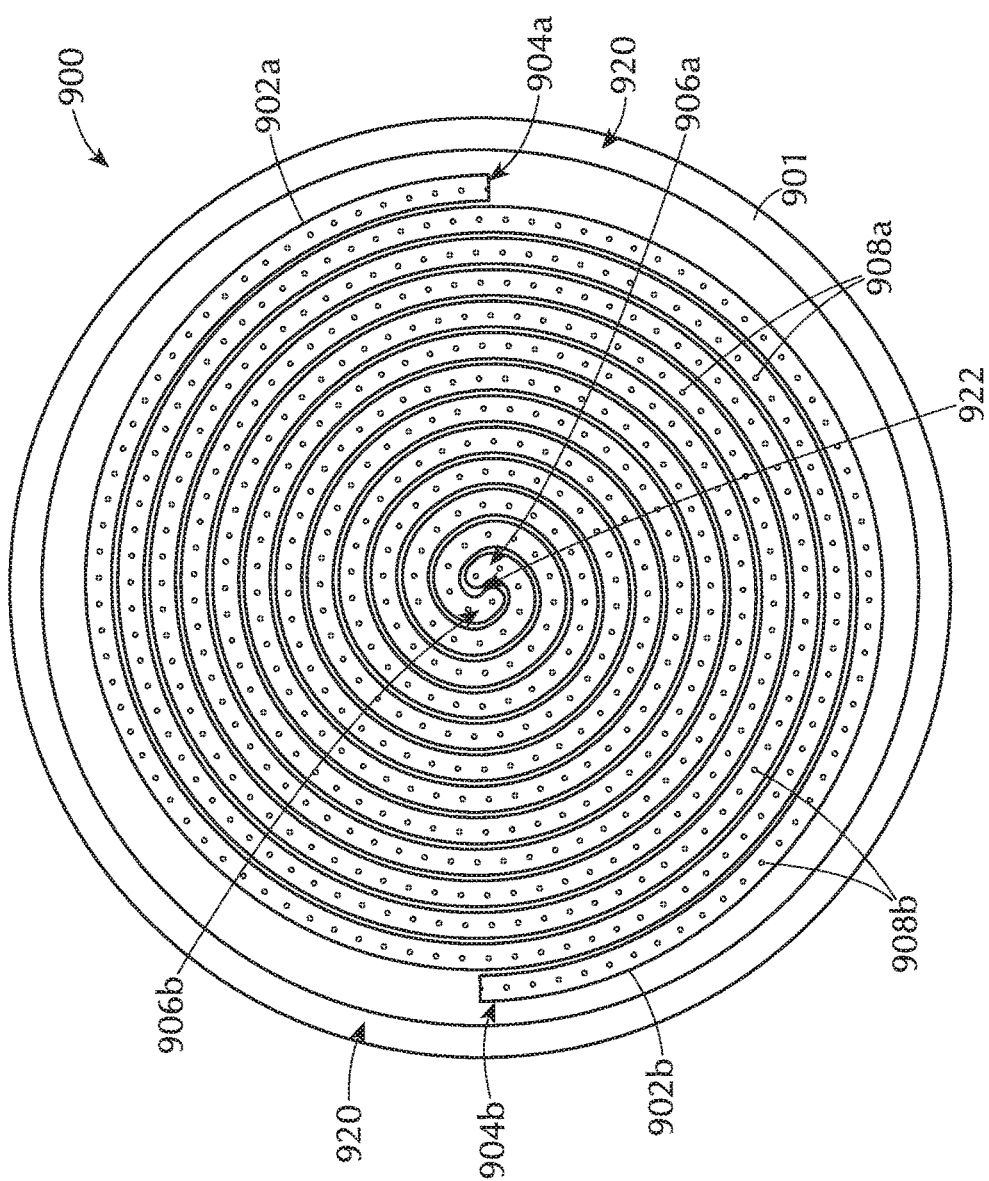
FIG. 9 shows a top view of a gas distribution apparatus in accordance with one or more embodiments of the disclosure.
Figure 11:
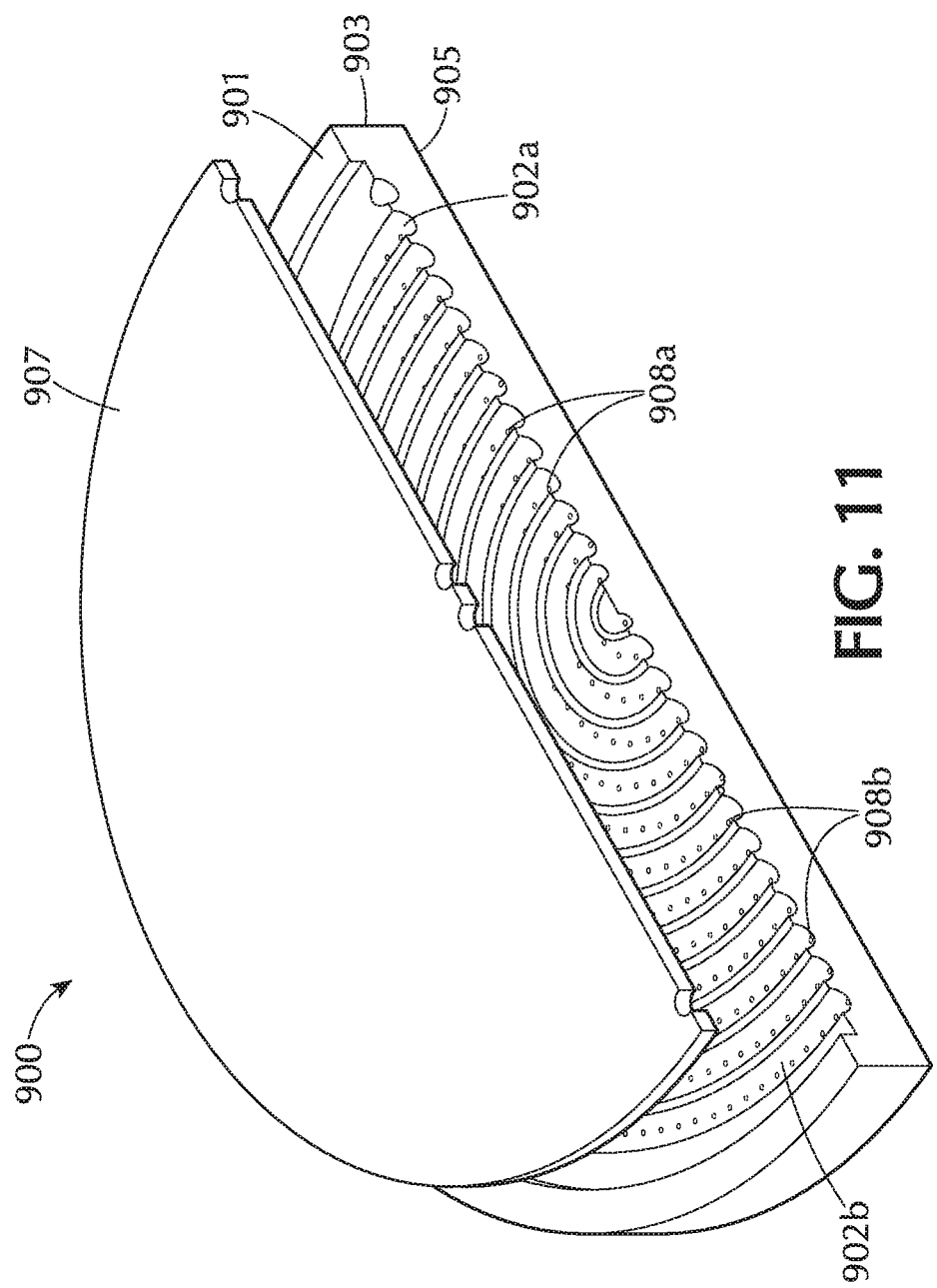
FIG. 11 shows a view of an exploded partial cross-sectional view of a gas distribution apparatus in accordance with one or more embodiments of the disclosure
Figure 12:
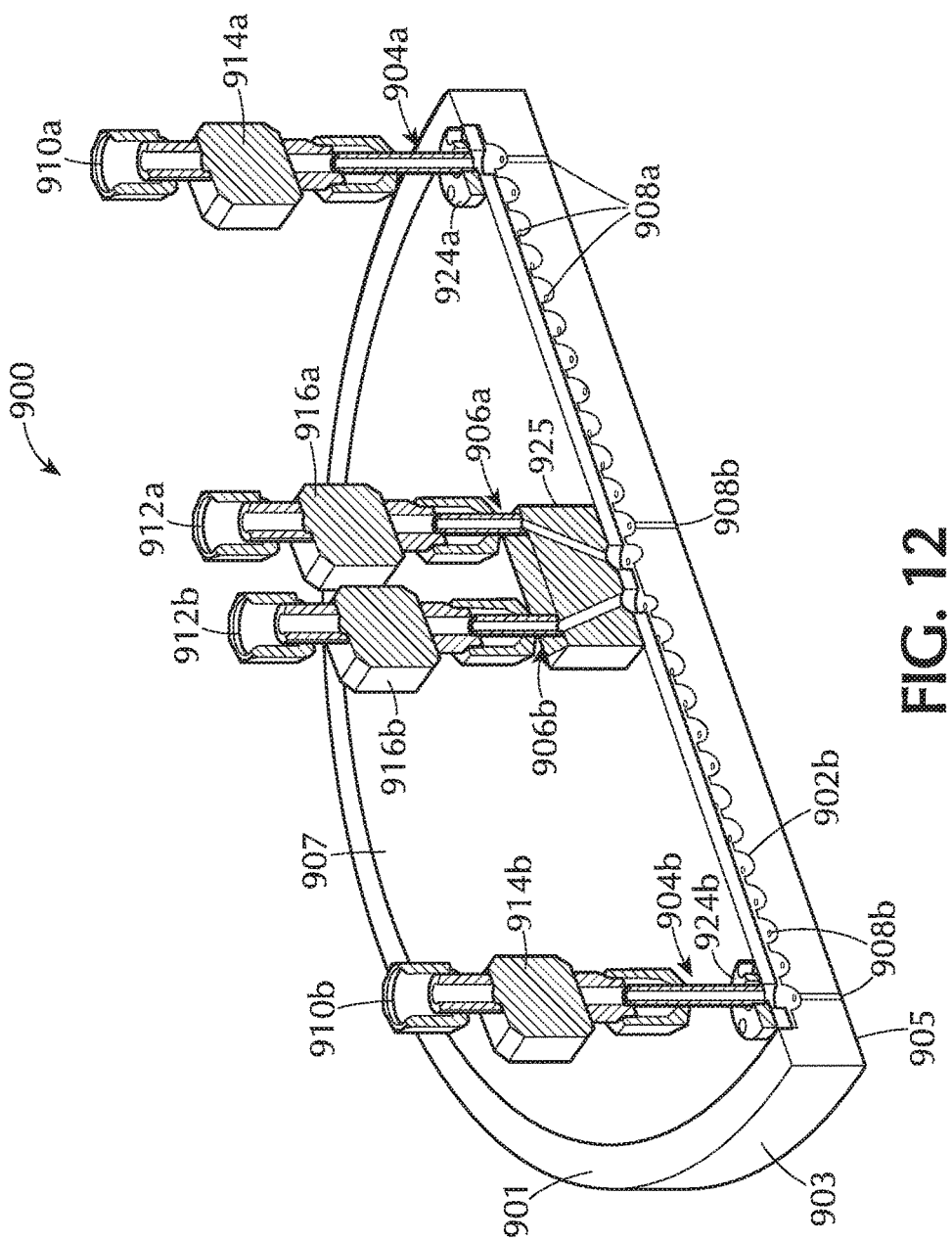
FIG. 12 shows a cross-section of a perspective view of a gas distribution apparatus in accordance with one or more embodiments of the disclosure
Figure 13:
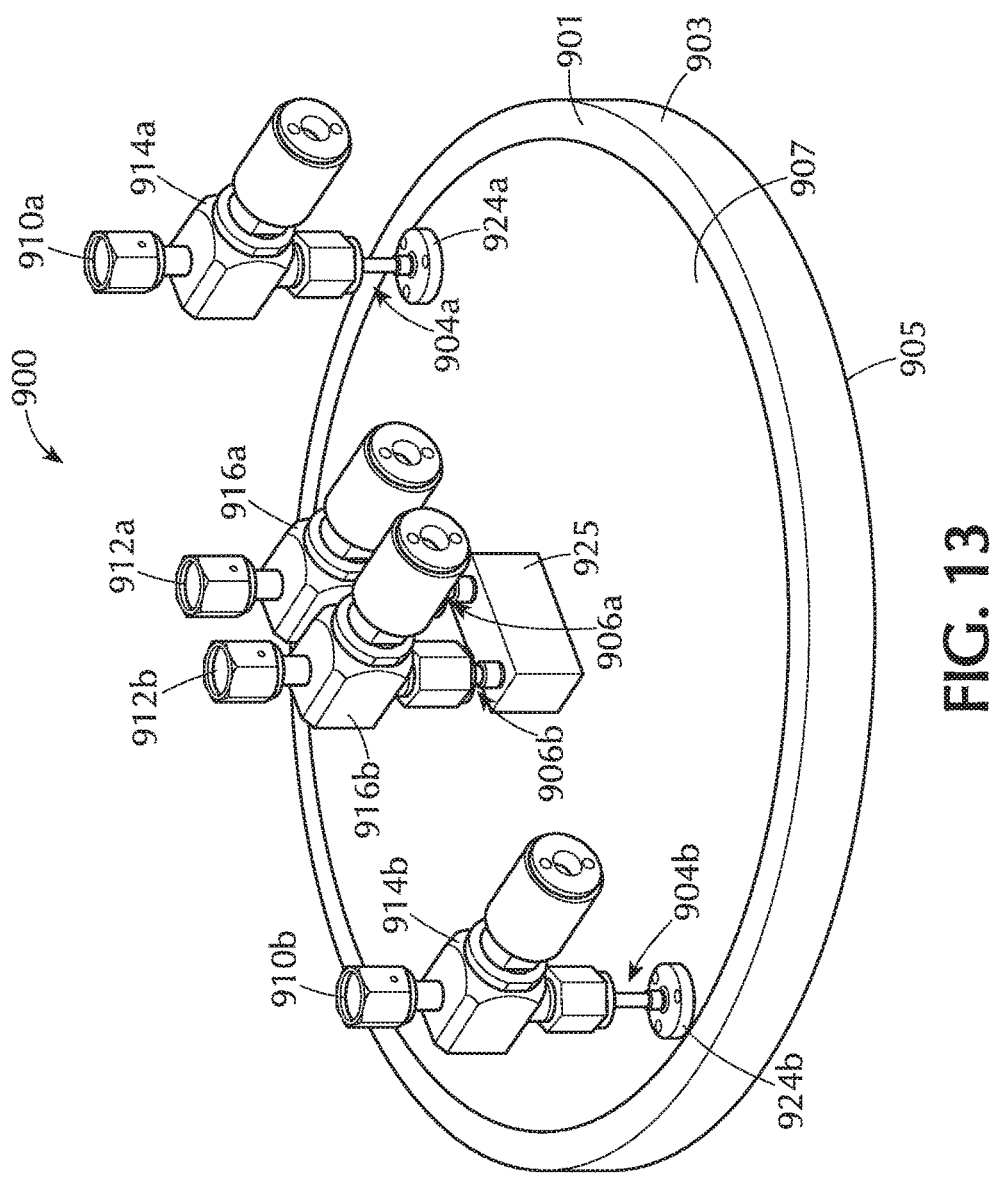
FIG. 13 shows a perspective view of a gas distribution apparatus in accordance with one or more embodiments of the disclosure.
Figure 14:
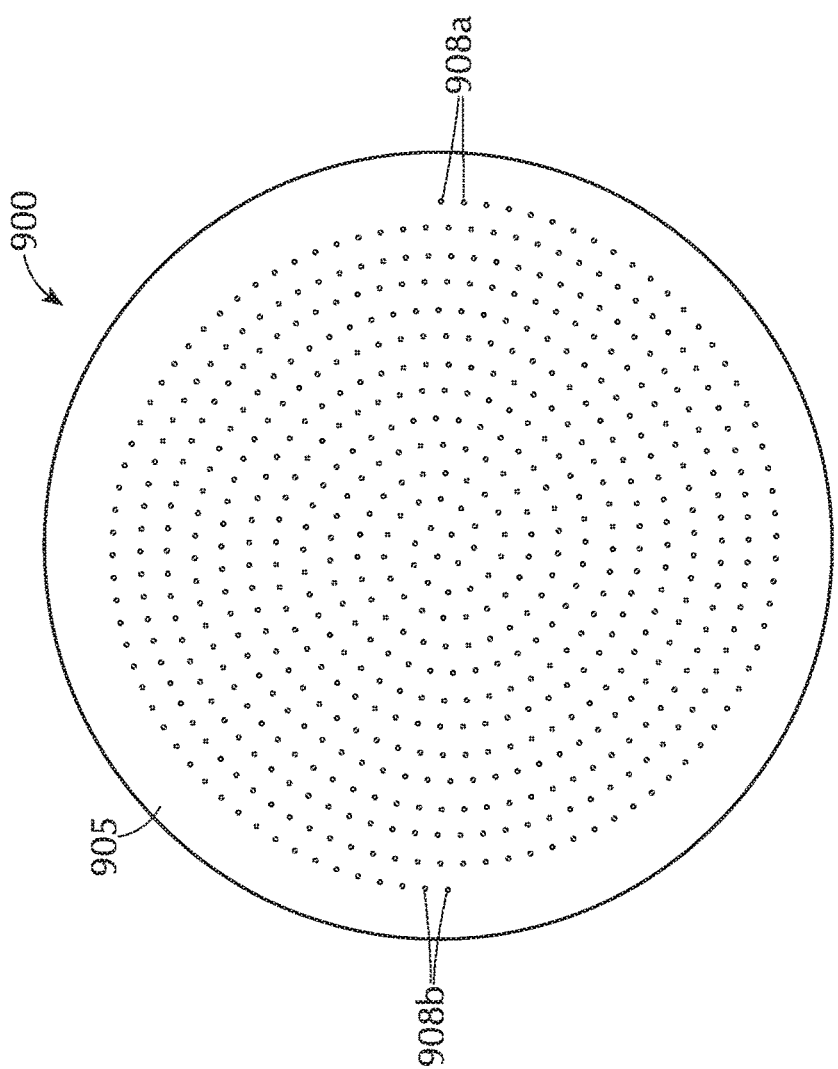
FIG. 14 shows a bottom view of a gas distribution apparatus in accordance with one or more embodiments of the disclosure.

FIG. 11 shows a back cover 907 for the gas distribution plate 903 shown in FIG. 9. There are four holes (not numbered) located in the back cover 907 which align approximately with the inlet ends 904a, 904b and outlet ends 906a, 906b of the delivery channels 902a, 902b. The holes can be used to provide an access point for connected in the inlet 910a, 910b and outlet 912a, 912b to the channels 902a, 902b. In some embodiments, there inlet 910a, 910b and outlet 912a, 912b are integrally formed with the back cover 907. Additionally, as seen in FIGS. 12 and 13, there can be one or more inlet valves 914a, 914b and outlet valves 916a, 916b FIGS. 12 and 13 show perspective views of a gas distribution apparatus 900 in accordance with various embodiments of the disclosure. The inlets 910a, 910b are shown connected to the back cover 907 with a flange 924a, 924b. The connection and gas-tight sealing of the flange 924a, 924b can be accomplished by any suitable mechanism and techniques as known to those skilled in the art. The outlets 912a, 912b can also be connected to the back cover 907 with a flange or with a block connection. The block 925 can be integrally formed with the back cover 907 or can be a separate piece. The block 925 may provide additional support and space for the outlet valves 916a, 916b, allowing the connecting tubes to protrude from the back cover 907 at an angle. Although the inlets 910a, 910b and inlet valves 914a, 914b are shown on the outside peripheral region 920 of the gas distribution plate 903 and the outlets 912a, 912b and outlet valves 916a, 916b are shown at the central region 922 of the gas distribution plate 903, it will be understood that these components can be reversed or intermixed and that the drawings are merely illustrative of one embodiment.

As the delivery channels spiral from the outer peripheral edge of the gas distribution plate to the central region, or vice versa, a seeming plurality of adjacent channels are observable in cross-section. With the spirals intertwined, the gas in every adjacent channel is from the other inlet 910a, 910b. The channels are separated by a distance from the adjacent channels. In some embodiments, the distance between the channels, measured from the center of the channel, are in the range of about 0.375 inches to about 0.475 inches, or in the range of about 0.40 inches to about 0.45 inches, or in the range of about 0.41 inches to about 0.43 inches. In one or more embodiments, the average distance between centers of the adjacent channels is about 0.42 inches.

The length of the gas channel shown in FIGS. 9-14 can vary depending on a number of factors, including, but not limited to, the diameter of the channel and the distance between the adjacent channels. In various embodiments, each of the delivery channels has a length in the range of about 70 inches to about 170 inches, or in the range of about 90 inches to about 150 inches, or in the range of about 100 inches to about 140 inches, or in the range of about 110 inches to about 130 inches. In one or more embodiments, the delivery channel has a length of about 120 inches.

The number of apertures are also dependent on a number of factors, including but not limited to, the length of the delivery channel and the spacing of the apertures. In some embodiments having a single spiral channel, there are in the range of about 150 and 450 apertures, or in the range of about 200 to about 400 apertures, or in the range of about 250 to about 350 apertures. In various embodiments, there are greater than about 150, 200, 250, 300, 350 or 400 apertures along the length of the channel. In one or more embodiments, there are about 300 apertures along the length of each of the delivery channels.

The apparatus shown in FIGS. 4 through 14 can be used for plasma processing. For example, the delivery channel, gas distribution apparatus or showerhead can be polarized relative to another portion of the processing chamber to ignite a plasma within the chamber. The delivery channel, gas distribution apparatus or showerhead can be polarized relative to a portion of the chamber, or a portion of the chamber can be biased relative to the delivery channel, gas distribution apparatus or showerhead. For example, the delivery channel, gas distribution apparatus or showerhead can be polarized relative to the pedestal, or the pedestal can be polarized relative to the delivery channel, gas distribution apparatus or showerhead. The frequency of the plasma can be tuned as well. In one or more embodiments, the plasma is at a frequency of about 13.56 MHz. In some embodiments, the plasma is at a frequency of about 40 MHz, 50 MHz, 60 MHz, 70 MHz, 80 MHz, 90 MHz, 100 MHz, 110 MHz or 120 MHz.

In some embodiments of the apparatus exemplified by FIGS. 4 through 14, there is an insulating material (not shown) positioned between the back cover and the main body portion of the gas distribution apparatus (i.e., the portion including the gas delivery channel). This insulating material provides electrical isolation between the back cover and the main body portion of the gas distribution apparatus so that the back cover can be polarized relative to the main body portion. Doing so may allow for the ignition of a plasma within the gas distribution apparatus, or within the delivery channels. The plasma can then be flowed through the plurality of apertures into the processing region of the processing chamber, the processing region being the region between the gas distribution apparatus and the pedestal. This configuration may be referred to as a remote plasma because the plasma is formed (e.g., ignited) outside of the processing region.

Figure 16A:
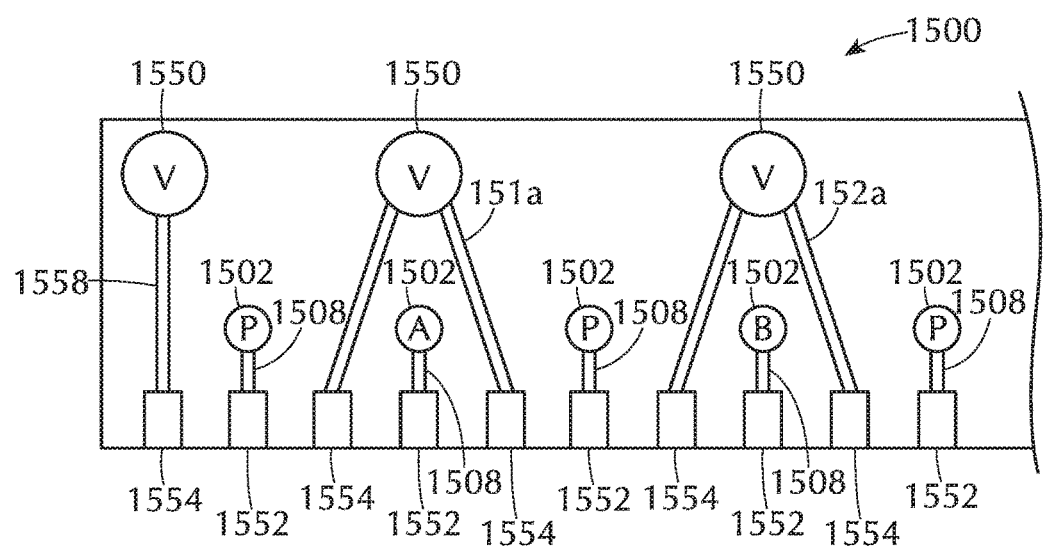
FIG. 16A shows a partial cross-sectional view of a gas distribution apparatus in accordance with one or more embodiments of the disclosure.
Figure 16B:
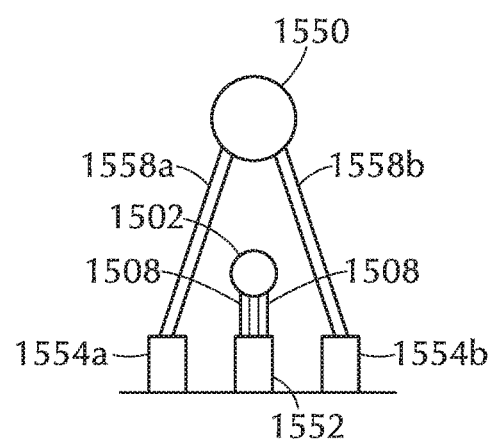
FIG. 16B shows a partial cross-sectional view of a gas distribution apparatus in accordance with one or more embodiments of the disclosure.

FIGS. 15, 16A and 16B show another exemplary embodiment of a gas distribution apparatus 1500. The gas distribution apparatuses shown are particularly useful for spatially separated atomic layer deposition processes in which different portions of the substrate are simultaneously exposed to different deposition gases and the substrate 1544 is moved relative to the gas distribution apparatus so that all parts of the substrate are exposed sequentially to each of the deposition gases. In these embodiments, the gas distribution apparatus 1500 comprises a plurality of delivery channels 1502, each delivery channel 1502 extending substantially straight and substantially parallel to adjacent delivery channels. Each of the delivery channels 1502 has an inlet end 1504 and an outlet end 1506 with a plurality of spaced apertures 1508 there between.

The gas distribution apparatus shown in FIGS. 15, 16A and 16B have a plurality of elongate delivery channels 1502 and a plurality of elongate vacuum channels 1550. Each of the delivery channels 1502 and vacuum channels 1550 are connected to a output channel 1552 at the front side of the gas distribution apparatus. Each of the delivery channels 1502 is adapted to flow one or more of a reactive gas and a purge gas. Each delivery channel 1502 is connected to an output channel 1552 by a plurality of spaced apertures 1508. Each of the vacuum channels 1550 is connected to an inlet channel 1554 by a plurality of spaced vacuum apertures 1558. The plurality of apertures 1508 of each delivery channel 1502 are separated from the plurality of apertures 1508 of each adjacent delivery channel 1502 by at least one of the plurality of vacuum apertures 1558 from a vacuum channel 1550.

In the embodiment shown in FIG. 16A, each of the central vacuum channels 1550 (not the end vacuum channels) are connected to two inlet channels 1554 by vacuum apertures 1508. The end vacuum channels 1550 are only connected to a single inlet channel 1554. It should be understood that this is merely exemplary and should not be taken as limiting the scope of the disclosure. Each inlet channel 1554 can have a dedicated vacuum channel 1550, or a single vacuum channel 1550 can be connected to more than two inlet channels 1554 through a plurality of vacuum apertures 1508.

While each of the delivery channels appears the same, there can be a different gas flowing through each. For example, purge channels (denoted P) may have a purge gas flowing there through, each of the first reactive gas channels (denoted A) may have a first reactive gas flowing there through and each of the second reactive gas channels (denoted B) may have a second reactive gas flowing there through. The vacuum channels (denoted V) are connected to a vacuum source. With reference to FIG. 16A, a substrate 1544 (or more specifically, a fixed point on a substrate) moving from left to right would encounter in order a vacuum gas channel, a purge gas channel, a vacuum gas channel, a first reactive gas channel, a vacuum gas channel, a purge gas channel, a vacuum gas channel, a second reactive gas channel, a vacuum gas channel, etc., depending on the size of the gas distribution plate.

The use of the delivery channels with inlet and outlet ends allows for the rapid exchange of gas within the delivery channel. For example, after the substrate (or fixed point on the substrate) is exposed to the second reactive gas channel (denoted B), the outlet end of the delivery channel can be opened, allowing the gas within the channel to be removed, and a different reactive gas (e.g., gas C) can then be flowed into the delivery channel. Thus, when the substrate passes back under that gas channel the substrate will be exposed to gas C instead of gas B. While this example has been made with respect to a second reactive gas, it will be understood by those skilled in the art that one of the gas delivery channels (first reactive gas, second reactive gas or purge gas) can be purged and replaced with a different gas.

The delivery channel of FIGS. 15, 16A and 16B can be used for plasma processing as well. The gas distribution apparatus 1500 can be biased relative to another portion of the chamber. For example, the gas distribution apparatus 1500 can be polarized relative to the pedestal, or the pedestal can be polarized relative to the gas distribution apparatus. The frequency of the plasma can be tuned as well. In one or more embodiments, the plasma is at a frequency of about 13.56 MHz. In some embodiments, the plasma is at a frequency of about 40 MHz, 50 MHz, 60 MHz, 70 MHz, 80 MHz, 90 MHz, 100 MHz, 110 MHz or 120 MHz.

FIG. 16B shows an embodiment of a single delivery channel 1502 and a single vacuum channel 1550. Each of the delivery channel 1502 and vacuum channel 1550 have two sets of apertures extending therefrom. In the case of the vacuum channel 1550, one set of apertures 1558a connect to a first inlet channel 1554a and the other set of apertures 1558b connects to a second inlet channel 1554b. The delivery channel 1502, on the other hand, has two sets of apertures 1508 extending to a single output channel 1552.

Figure 17:
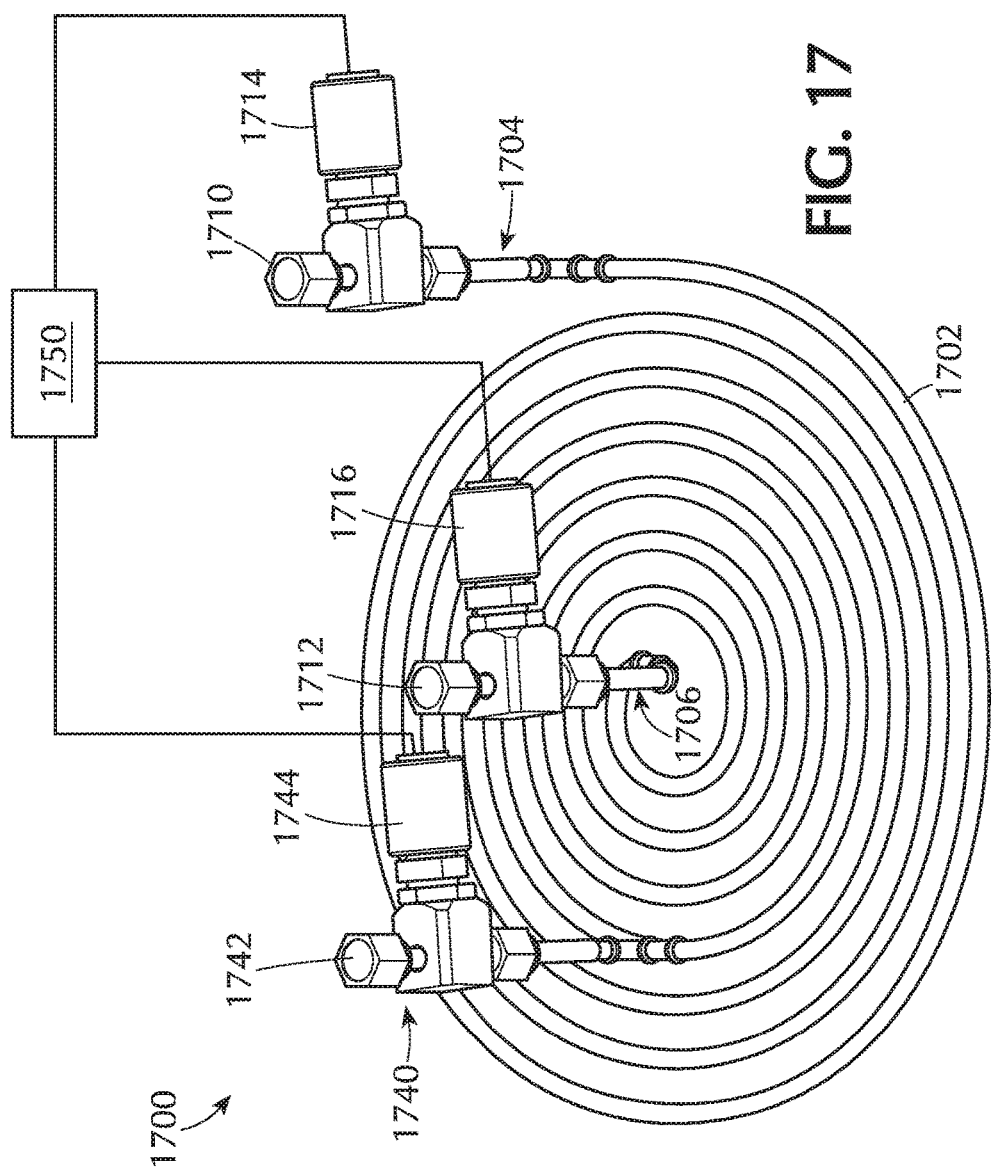
FIG. 17 shows a gas distribution apparatus in accordance with one or more embodiments of the disclosure.

In one or more embodiments, the gas distribution apparatus includes more than one outlet connected to a vacuum source. FIG. 17 shows a spiral shaped gas distribution apparatus 1700 which is similar to the apparatus 100 shown in FIG. 1. The apparatus includes a delivery channel 1702 with an inlet end 1704 and an outlet end 1706. An inlet 1710 is connected to and in communication with the inlet end 1704 of the delivery channel 1702. An outlet 1712 is connected to and in communication with the outlet end 1706 of the delivery channel 1702. The inlet 1710 is connectable to a gas source and may include an inlet valve 1714 that can control the flow of gas into (or out of) the delivery channel 1702 or completely cut off the flow of gas. The outlet 1712 is connectable to a vacuum source (not shown) and may include an outlet valve 1716 that can control the flow of gas out of (or into) the delivery channel 1702 or completely cut off the vacuum source from the delivery channel 1702. An intermediate outlet 1742 which is connectable to the vacuum source (not shown) is position along the length of the delivery channel 1702. The intermediate outlet 1742 shown is connected to the delivery channel 1702 at about the middle of the length of the channel 1702 and coupled to the delivery channel 1702 through an intermediate outlet 1740. The intermediate outlet 1742 may include an intermediate outlet valve 1744 that can control the flow of gas out of (or into) the delivery channel 1702 or completely cut off the vacuum source from the delivery channel 1702. The inlet valve 1714 of the inlet 1710, the outlet valve 1716 of the outlet 1712 and the intermediate outlet valve 1744 of the intermediate outlet 1740 are connected to a controller 1750. The controller is capable of independently opening or closing any or all of the valves to adjust the pressure of gases flowing through the delivery channel 1702 or purge the delivery channel 1702 of an existing gas. For example, Table 2 shows a processing sequence that may be used with the embodiment shown in FIG. 17. It will be understood by those skilled in the art that this is merely an example and should not be taken as limiting the scope of the disclosure.

TABLE 2

| Step | Gas Source | Intermediate Outlet valve | Outlet valve |
| --- | --- | --- | --- |
| 1a | Precursor A | Closed | Partially Open |
| 1b | Precursor A | Closed | Closed |
| 2a | Purge | Open | Closed |
| 2b | Purge | Open | Open |
| 2c | Purge | Open | Closed |
| 3a | Precursor B | Partially Open | Closed |
| 3b | Precursor B | Closed | Closed |

The valves shown in Table 2 are open, closed or partially open at any point during the processing. In Step 3a, after purging the delivery channel of Precursor A, the intermediate outlet valve is partially open to accelerate the flow of Precursor B through the delivery channel and then closed in Step 3b. This is merely one possible sequence that can be used and should not be taken as limiting the scope of the disclosure.

The embodiment shown in FIG. 17 effectively includes two outlets, one at the end of the delivery channel and one in the middle. Those skilled in the art will understand that there can be any number of outlets spaced along the length of the delivery channel and at any position along the length of the channel. For example, the intermediate outlet 1740 could be positioned at ⅓ of the length of the channel. Additionally, there can be any number of outlets. For example, the delivery channel may have four outlets, one at the end and one positioned at each of ¼, ½ and ¾ of the length of the delivery channel. In another example, the delivery channel includes four outlets, one at the end and one position at each of ¼, ¾ and 9/10 of the length of the delivery channel. In some embodiments, the delivery channel includes 2, 3, 4, 5, 6, 7, 8, 9, 10 or 11 total outlets (including an outlet at the outlet end of the channel).

Some spiral showerheads allow for the addition of a supplemental gas to be injected into the processing chamber while maintaining the separation between the supplemental gas and the gases flowing along the length of the spiral channels. The supplemental gas may be used, for example, for process enhancement or cleaning. In one or more embodiments, a supplemental gas flow path through an edge injector ring is added to uniformly distribute a supplemental gas around the top edge of the substrate without mixing with the other process chemistries flowing through the spiral showerhead channels. Gas for the supplemental channel can be split into two or more paths using gaslines before connecting to the edge ring. The supplemental gas can flow into a channel (plenum) in the edge ring which distributes the gas evenly before exiting out through small trenches spaced around the ring. The gas passes through a gap between the edge ring inner diameter surface and the spiral showerhead outer diameter surface.

With reference to FIGS. 18-21, one or more embodiments of the disclosure are directed substrate processing chambers 1800 including a gas distribution apparatus 1805 with a gas distribution plate 1900 and edge ring 2000. The substrate processing chamber includes a substrate support 1810 having a top surface 1812 to support a substrate 1804. A process region 1850 is bounded by the top surface 1812 of the substrate support 1810, on the sides by a confinement ring 1820 and on the top by the gas distribution plate 1900.

The gas distribution plate 1900 has an outer peripheral edge 1902, a front side 1906 and a back side 1904. At least one delivery channel 1903a, 1903b is recessed in the back side 1904 of a gas distribution plate 199. As shown in the embodiment of FIG. 9, the at least one channel 902a, 902b has an inlet end 904a, 904b, an outlet end 906a, 906b and a length. The delivery channel including a plurality of apertures 1908a, 1908b spaced along the length extending through the gas distribution plate 1900 to the front side 1906 of the gas distribution plate 1900.

Figure 18:
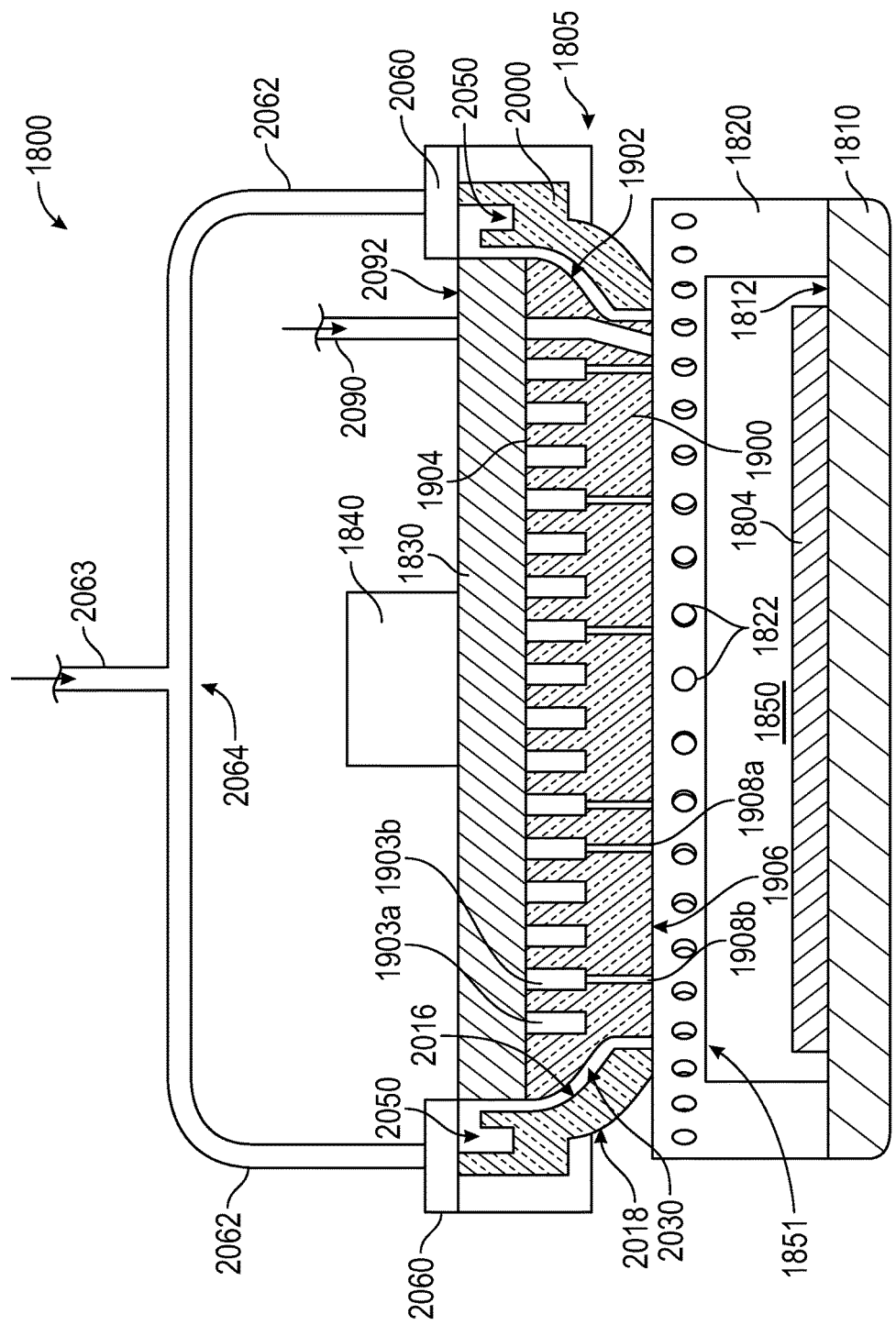
FIG. 18 shows a cross-reference of a processing chamber in accordance with one or more embodiments of the disclosure.
Figure 19:
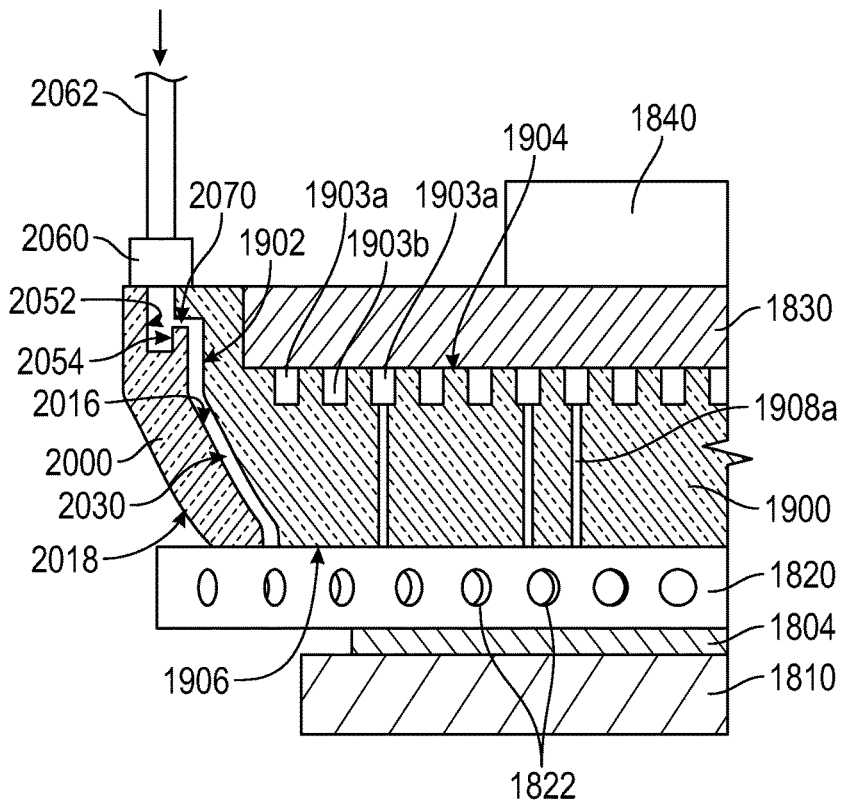
FIG. 19 shows a partial view of a processing chamber in accordance with one or more embodiments of the disclosure.
Figure 20:
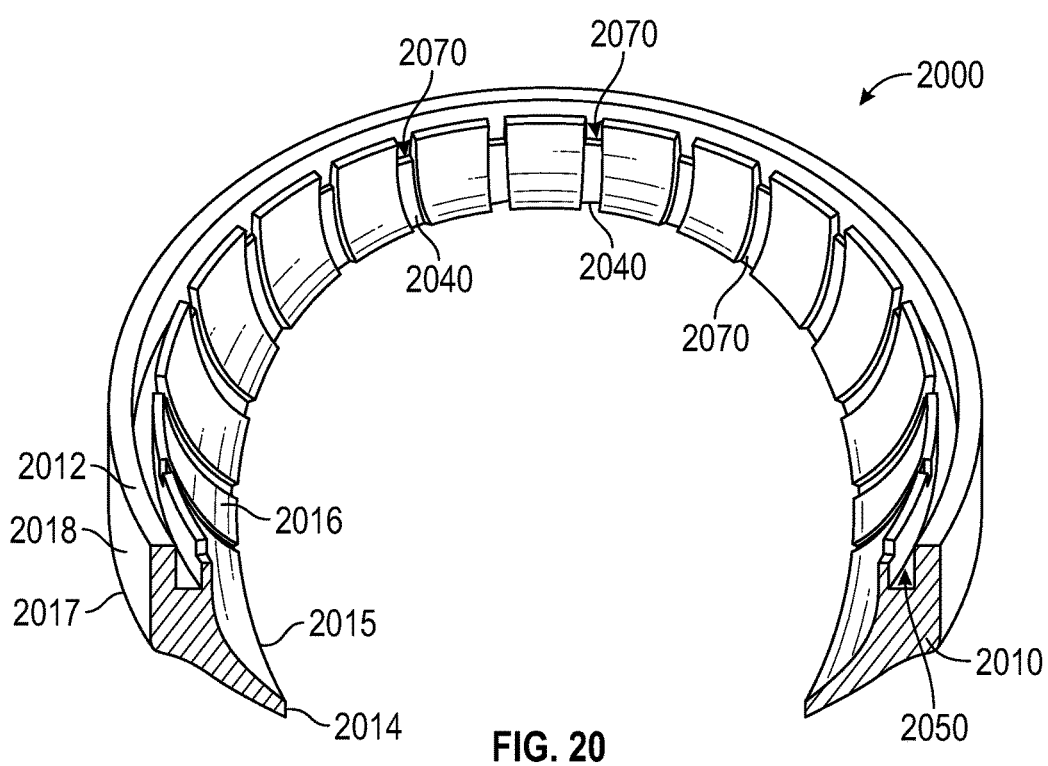
FIG. 20 shows a segment of a perspective view of an edge ring in accordance with one or more embodiments of the disclosure.

As shown in FIGS. 18 and 19, the edge ring 2000 is positioned around the outer peripheral edge 1902 of the gas distribution plate 1900. The edge ring 2000 has a round body with a top 2012, bottom 2014, inner diameter 2015 with an inner diameter face 2016 and an outer diameter 2017 with an outer diameter face 2018. FIG. 20 shows a cross-section of an edge ring 2000 shown in perspective.

Referring back to FIGS. 18 and 19, the edge ring 2000 is positioned so that there is a gap 2030 between the outer peripheral edge 1902 of the gas distribution plate 1900 and the inner diameter face 2016 of the edge ring 2000. The size of the gap 2030 can be in the range of about 0.02 mm to about 3 mm. The gap 2030 can be uniform around the inner diameter face 2016 or can be formed as a plurality of channels or trenches 2040.

Figure 21:
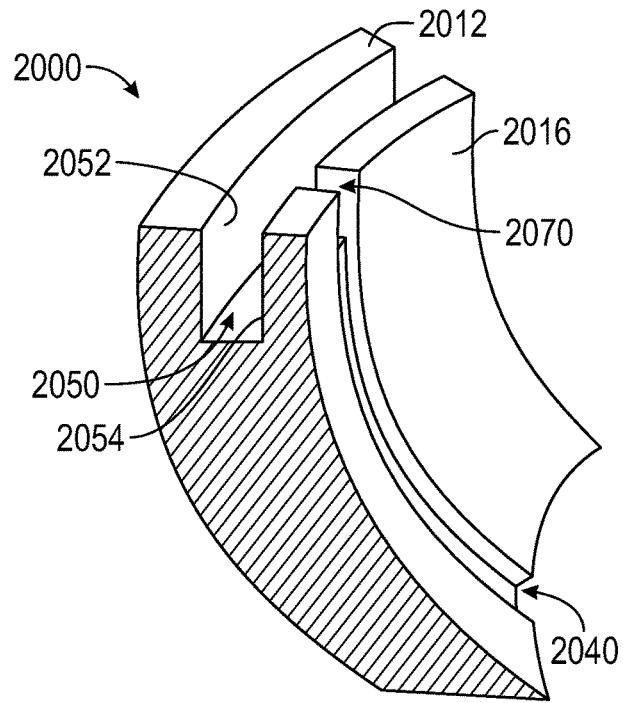
FIG. 21 shows a partial perspective view of an edge ring in accordance with one or more embodiments of the disclosure.

In some embodiments, the outer peripheral edge 1902 of the gas distribution plate 1900 contacts the inner diameter face 2016 of the edge ring 2000 except at the trenches 2040 forming a plurality of gaps 2030. The partial embodiment shown in FIG. 21 illustrates an edge ring 2000 with a single trench 2040. When the inner diameter face 2016 of the edge ring 2000 is positioned to contact the outer peripheral edge 1902 of the gas distribution plate 1900, the gap 2030 will be formed in the region defined by the trench 2040. In some embodiments, the trenches 2040 have a width (distance along the inner diameter face 2016) and depth (distance into the inner diameter face 2016) and extend from a top of the inner diameter face 2016 to the bottom of the inner diameter face 2016. The width and depth of the trenches 2040 can be varied independently. In some embodiments, the width and/or depth of the trenches in the range of about 0.02 mm to about 3 mm.

A plenum 2050 is formed in the top 2012 of the round body 2010 of the edge ring 2000. The plenum 2050 has an outer peripheral face 2052 and an inner peripheral face 2054 defining a width of the plenum. The volume of the plenum 2050 can vary depending on, for example, the size of the edge ring 2000. In some embodiments, the plenum 2050 has a volume in the range of about 100 mL to about 900 mL, or in the range of about 200 mL to about 800 mL, or in the range of about 300 mL to about 700 mL, or in the range of about 400 mL to about 600 mL, or about 500 mL.

The volume of gas in the plenum 2050 and the combined volume of the openings 2070 and trenches 2040 may be related to increase the uniformity of gas flowing out of the trenches 2040. When referring to the volume of the trenches 2040, those skilled in the art will understand that this includes the volume of the openings 2070 that are integral with the trenches 2040. In some embodiments, the combined volume in the trenches 2040 for all of the trenches 2040 around the periphery of the edge ring is in the range of about 20 mL to about 240 mL, or in the range of about 40 mL to about 180 mL, or in the range of about 60 mL to about 120 mL.

The ratio of the combined volume of the trenches 2040 to the volume of the plenum 2050 may affect the gas uniformity. In some embodiments, the ratio of a combined volume of the trenches 2040 to a volume of the plenum 2050 is in the range of about 10% to about 30%. In one or more embodiments, the volume of the trenches 2040 is about 20% of the volume of the plenum 2050.

A plurality of openings 2070 in the inner diameter face 2016 of the plenum 205 form a plurality of channels connecting the plenum 2050 with the gap 2030. In the embodiment shown in FIG. 21, the channel opening 2070 is aligned with and continuous with the trench 2040. The plurality of openings 2070 and/or trenches 2040 of some embodiments are substantially equally spaced about the inner diameter face 2016. As used in this regard, the term "substantially equally spaced" means that there is no more than a 10% relative difference in the average distance between each opening 2070 around the inner diameter face 2016. As shown in FIG. 20, there can be any suitable number of trenches 2040 and openings 2070 around the inner diameter face 2016. In some embodiments, there is in the range of about 12 and about 120 openings 2070 in the inner diameter face 2016. In some embodiments, there is about 36 openings 2070 in the inner diameter face 2016 and each of the openings 2070 are aligned with and continuous with a trench 2040.

Figure 22:
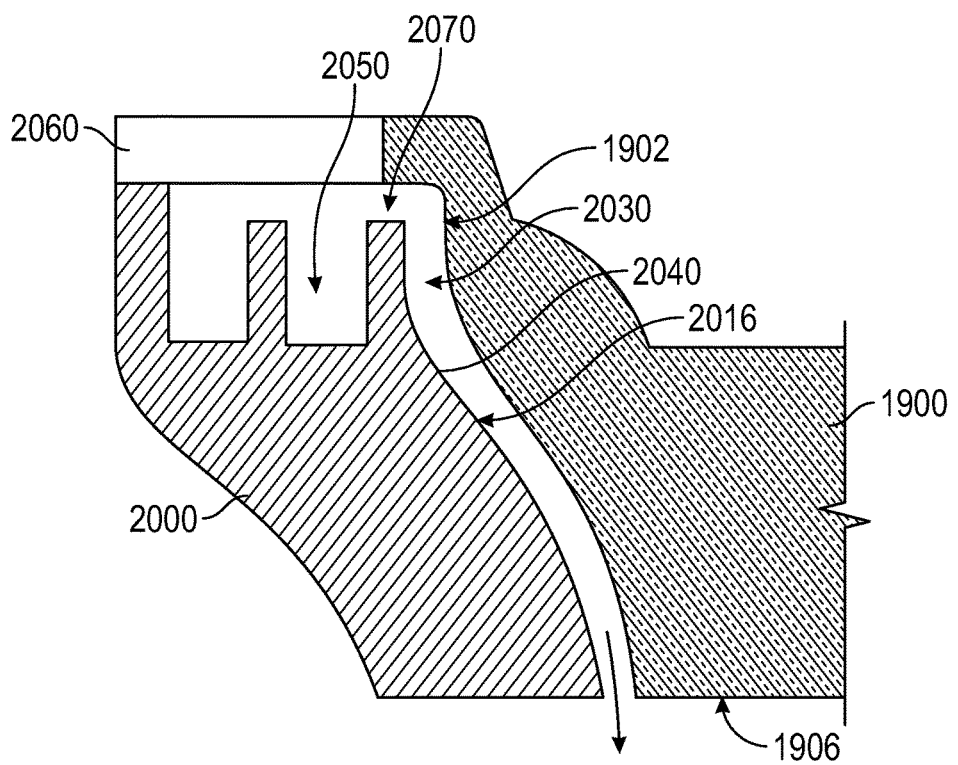
FIG. 22 shows a cross-sectional view of an edge ring in accordance with one or more embodiments of the disclosure.

FIG. 22 shows a cross-sectional view shown at trench 2040. There is a gap 2030 between the inner diameter face 2016 and the outer peripheral edge 1902. The gap 2030 between the inner diameter face 2016 of the outer distribution ring 2000 and the outer peripheral edge 1902 of the gas distribution plate 1900 is shaped to direct a gas to flow down the inner diameter face 2016 within the trench 2040. The gas flows from the plurality of trenches 2040 out the front side 1906 of the gas distribution apparatus 1900. The direction or angle that the gas flows out of the gap 2030 can be varied from angled inward toward the central axis of the outer distribution ring 2000 to angled outward from the central axis. In some embodiments, the gas flows out of the gap 2030 a direction substantially concentric with the central axis of the body 2010 of the outer distribution ring 2000. A direction substantially concentric with the central axis means that the gas is flowing out of the gap 2030 along a path parallel to the central axis.

Figure 23:
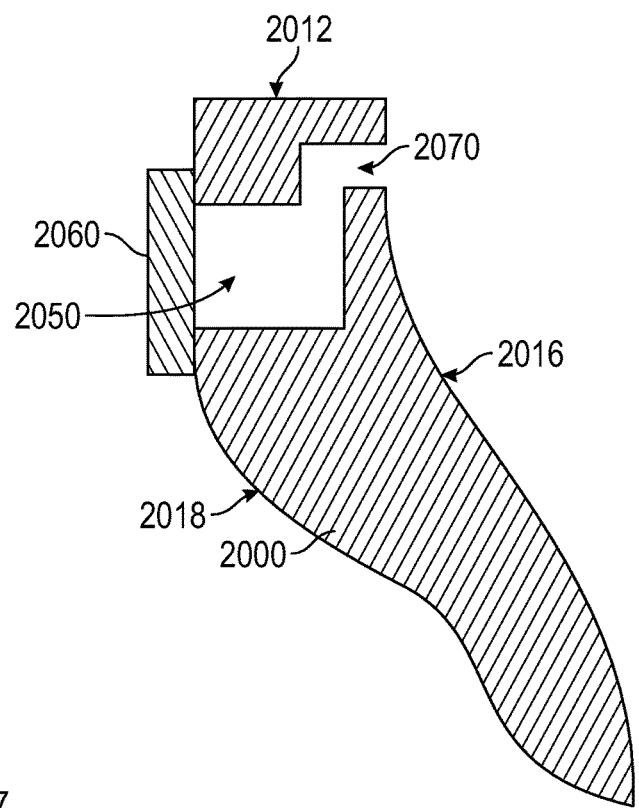
FIG. 23 shows a cross-sectional view of an edge ring in accordance with one or more embodiments of the disclosure.

At least one gas inlet 2060 is in fluid communication with the plenum 2050 so that a gas can flow through inlet line 2062 and gas inlet 2060 into the plenum 2050. In some embodiments, as shown in FIG. 19, the gas inlet 2060 connects to the plenum 2050 through the top 2012 of the body 2010 of the outer distribution ring 2000. In some embodiments, as shown in FIG. 23, the gas inlet 2060 connects to the plenum 2050 through the outer diameter face 2018 of the body 2010. Some embodiments are directed to an outer distribution ring 2000 that might be retrofit into an existing processing chamber. In this case, there may not be sufficient room above the existing gas distribution assembly to allow for additional gas inlets.

Figure 24:
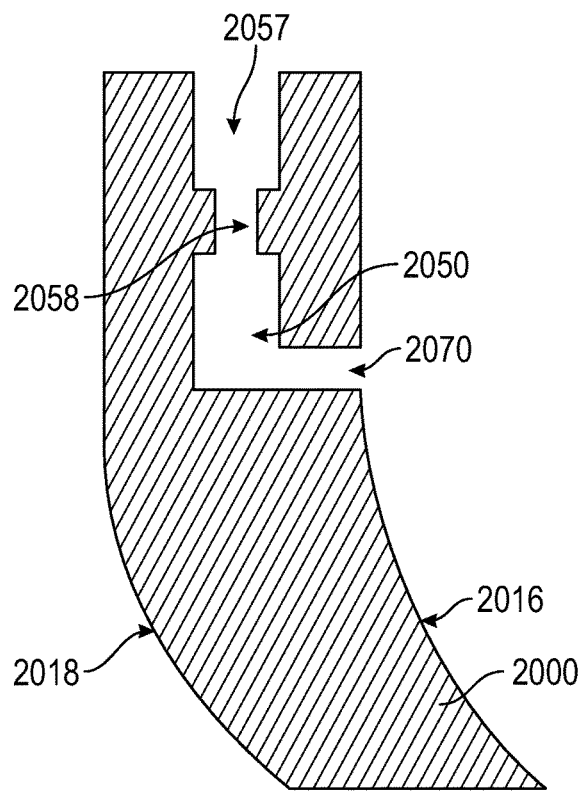
FIG. 24 shows a cross-sectional view of an edge ring in accordance with one or more embodiments of the disclosure.

As shown in FIG. 24, some embodiments include a second plenum 2057. The second plenum 2057 may allow for the further equalization of gases within the plenum 2050 before flowing into the process region through the trench 2040. The second plenum 2057 can be located in any suitable position and may be located between the gas inlet 2060 and the plenum 2050. The second plenum 2057 is in fluid communication with the plenum 2050 through a plurality of apertures 2058. There can be any number of apertures 2058 extending around the body 2010. In some embodiments, there is in the range of about 36 apertures to about 720 apertures.

Figure 25:
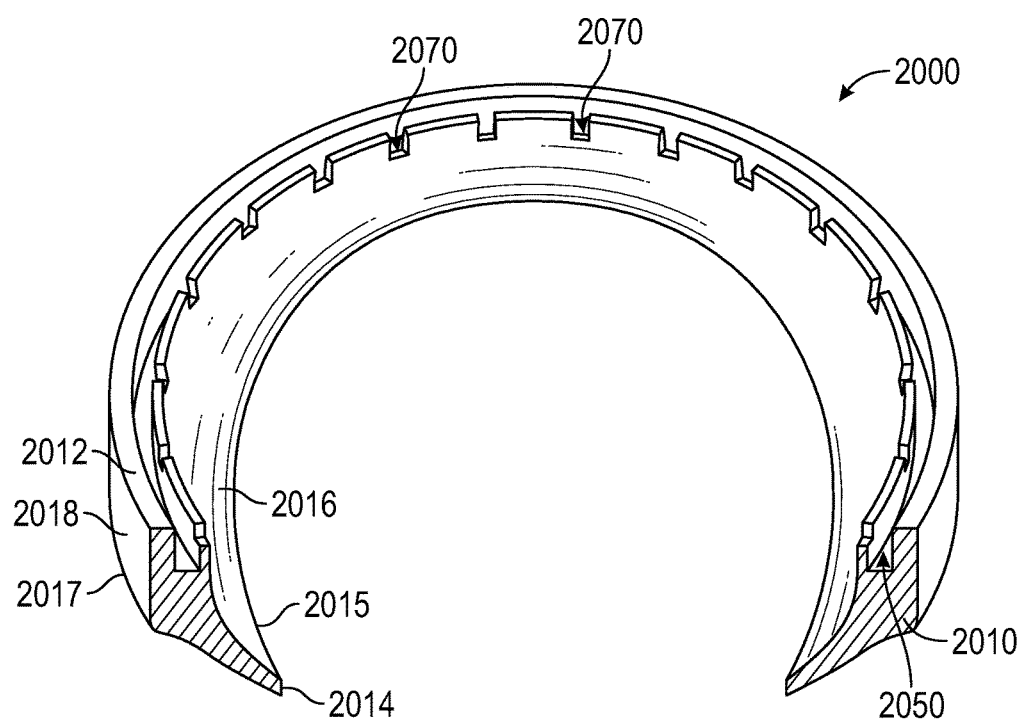
FIG. 25 shows a segment of a perspective view of an edge ring in accordance with one or more embodiment of the disclosure.

FIG. 25 shows another embodiment similar that that of FIG. 20. In the embodiment of FIG. 25, the edge ring 2000 is positioned so that there is a gap 2030 (see FIGS. 18 and 19) between the outer peripheral edge 1902 of the gas distribution plate 1900 and the inner diameter face 2016 of the edge ring 2000. The size of the gap 2030 can be in the range of about 0.02 mm to about 3 mm. In the embodiment shown, the gap 2030 is substantially uniform around the inner diameter face 2016 so that the trenches 2040 of FIG. 20 are not included.

A plenum 2050 is formed in the top 2012 of the round body 2010 of the edge ring 2000. The plenum 2050 has an outer peripheral face 2052 and an inner peripheral face 2054 defining a width of the plenum. The volume of the plenum 2050 can vary depending on, for example, the size of the edge ring 2000. In some embodiments, the plenum 2050 has a volume in the range of about 100 mL to about 900 mL, or in the range of about 200 mL to about 800 mL, or in the range of about 300 mL to about 700 mL, or in the range of about 400 mL to about 600 mL, or about 500 mL.

The volume of gas in the plenum 2050 and the combined volume of the openings 2070 may be related to increase the uniformity of gas flowing out of the openings 2070. In some embodiments, the combined volume in the openings 2070 around the periphery of the edge ring is in the range of about 2 mL to about 240 mL, or in the range of about 20 mL to about 180 mL, or in the range of about 60 mL to about 120 mL.

The ratio of the combined volume of the openings 2070 to the volume of the plenum 2050 may affect the gas uniformity. In some embodiments, the ratio of a combined volume of the openings 2070 to a volume of the plenum 2050 is in the range of about 10% to about 30%. In one or more embodiments, the volume of the openings 2070 is about 20% of the volume of the plenum 2050.

The plurality of openings 2070 of some embodiments are substantially equally spaced about the inner diameter face 2016. As used in this regard, the term "substantially equally spaced" means that there is no more than a 10% relative difference in the average distance between each opening 2070 around the inner diameter face 2016. As shown in FIG. 25, there can be any suitable number of openings 2070 around the inner diameter face 2016. In some embodiments, there is in the range of about 12 and about 120 openings 2070 in the inner diameter face 2016. In some embodiments, there is about 36 openings 2070 in the inner diameter face 2016 and each of the openings 2070 are aligned with and continuous with a trench 2040.

Referring to FIGS. 18 and 19, some embodiments include a temperature control element 1830. The temperature control element 1830 can be a heater or cooler and can be used to maintain a set temperature for the process gases flowing through channels 1903a, 1903b. A gas inlet 1840 can also be connected to the gas distribution plate 1900 either through the temperature control element 1830 or directly to the gas distribution plate 1900. The gas inlet 1840 is shown in the middle of the gas distribution plate 1900 but those skilled in the art will understand that this can be positioned in any suitable location and can be any suitable size.

The confinement ring 1820 helps contain the process gases in the process region 1850. The confinement ring 1820 shown in FIGS. 18 and 19 includes a plurality of openings 1822 to allow a flow of gas to pass from the process region 1850 to exhaust out of the processing chamber. The gas flowing through the gap 2030 flows into an outer edge region 1851 of the process region 1850. The gas flow in the outer edge region 1851 mixes with gases from the center of the process region 1850. The mixed gases flow through the openings 1822 to exhaust. In some embodiments, the use of the gas flowing through the outer distribution ring 2000 increases the uniformity of deposition around the edges of the substrate 1804.

Figure 26:
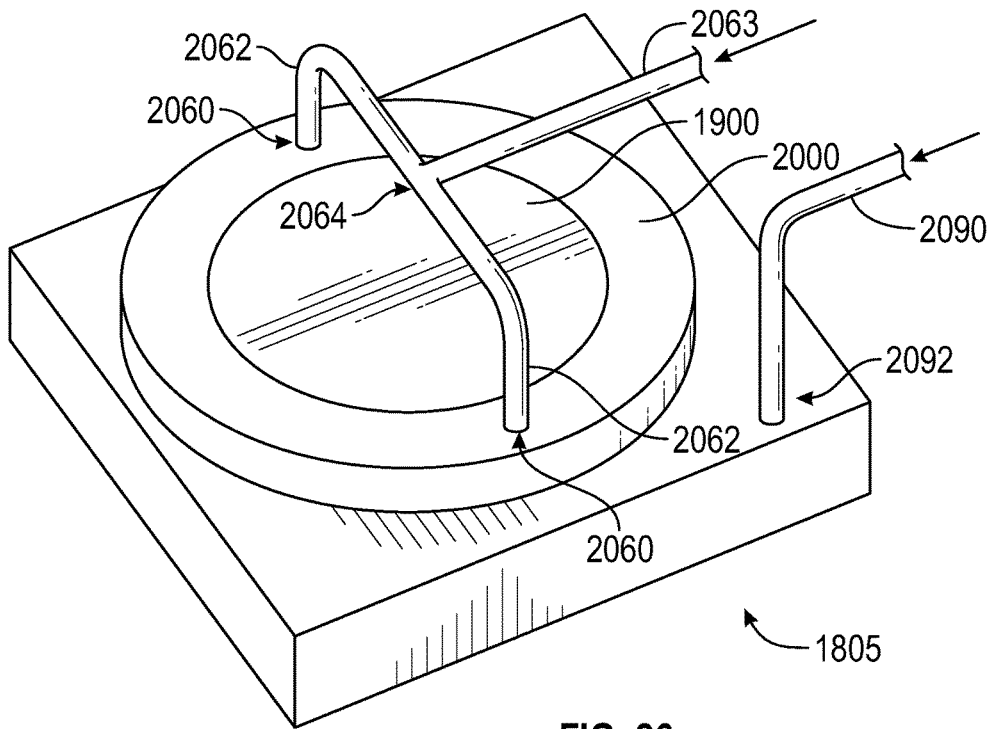
FIG. 26 shows a perspective view of a gas distribution apparatus in accordance with one or more embodiments of the disclosure.

Referring to FIGS. 18 and 26, some embodiments have multiple gas inlets 2060. In the embodiments shown, there are two gas inlets 2060 connected to the outer distribution ring 2000. The gas inlets 2060 can have independent gas supplies or can share a gas supply. In some embodiments, the gas inlets 2060 share a single gas supply that is split at a junction 2064. In the embodiment shown, a first gas line segment 2063, which may be connected to a gas source, is in fluid communication with a junction 2064 that splits the first gas line segment 2063 into two second gas line segments which become the inlet line 2062 which is connected to the gas inlet 2060. There can be any suitable number of gas inlets 2060 around the outer distribution ring 2000. In some embodiments, there are in the range of about 1 to about 12 gas inlets, or in the range of about 2 to about 6 gas inlets. In some embodiments, there are two gas inlets, or four gas inlets. There can be any suitable number of gas sources connected to the inlets. For example, an embodiment with four gas inlets may have one, two, three or four gas sources. A single gas source could be split into four gas line segments. To increase the uniformity of gas flowing into the outer distribution ring 2000, the second gas line segments have substantially the same gas conductance. As used in this regard, the term "substantially the same gas conductance" means that the conductance through any second gas line segment is within ±10% of the average conductance through all of the second gas line segments.

In some embodiments, a supplemental gas inlet 2092 is in fluid communication with a supplemental gas line 2090. The supplemental gas inlet 2092 allows the supplemental gas flowing through the supplemental gas line 2090 to pass through the gas distribution apparatus 1805 to flow the supplemental gas into the process region 1850. The supplemental gas can be any suitable gas including, but not limited to, reactive gases, inert gases and cleaning gases. The supplemental gas inlet 2092 can route the gas flow through any portion of the gas distribution apparatus 1805 that does not interfere with the gas flows of the outer distribution ring 2000 or the gas distribution plate 1900.

Figure 27:
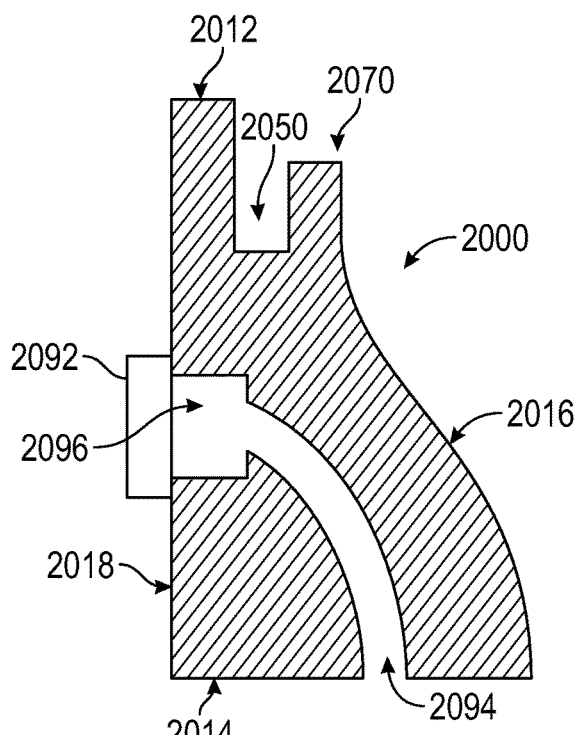
FIG. 27 shows a cross-sectional view of an edge ring in accordance with one or more embodiments of the disclosure.

FIG. 27 shows a cross-sectional view of an embodiment of an outer distribution ring 2000 that includes a supplemental gas inlet 2092 in the outer diameter face 2018 of the outer distribution ring 2000. The supplement gas can be connected to the supplemental gas inlet 2092 to flow into the optional supplemental plenum 2096 and into the process region 1850 through supplemental gas channel 2094. There can be any suitable number of supplemental gas channels 2094 distributed around the periphery of the outer distribution ring 2000. In use, for example, two reactive gases can be flowed into the process region 1850 through the gas distribution plate 1900 while an inert gas is flowed into the outer edge region 1851 of the process region 1850. The inert gas in the outer edge region 1851 may help force the flow of reactive gases from the process region 1850 through openings 1822 to exhaust. After processing, the reactive gas flow through the gas distribution plate 1900 and the inert gas flow through the outer distribution ring 2000 can be stopped and the flow of supplemental gas through the supplemental gas inlet 2092 can be started. This may allow for the admission of an etchant or cleaning gas into the process region 1850 through a dedicated gas line. Those skilled in the art will understand that there can be any suitable number of supplemental gas lines connected to the process region 1850 through the outer distribution ring 2000 or the gas distribution plate 1900. Those skilled in the art will also recognize that there are other processing sequences that can be employed without deviating from the scope of the disclosure.

The gas distribution apparatus described can be used to form one or more layers during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). Remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required.

According to one or more embodiments, the gas distribution apparatus can be used to subject a substrate to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura® both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

A substrate can be processed in single substrate deposition chambers using, for example, the gas distribution apparatus described. In such chambers, a single substrate is loaded, processed and unloaded before another substrate is processed. A substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. An outer distribution ring comprising
a round body having a top, bottom, inner diameter with an inner diameter face and an outer diameter with an outer diameter face;
a plenum formed in the top of the round body, the plenum having an outer peripheral face and an inner peripheral face defining a width and having a volume in a range of about 100 mL to about 900 mL; and
a plurality of openings in the inner peripheral face of the plenum forming a plurality of trenches connecting the plenum with the inner diameter face, the plurality of trenches substantially equally spaced about the inner peripheral face, the plurality of trenches extending from a top of the inner diameter face to a bottom of the inner diameter face, and the trenches having a combined volume in a range of about 20 mL to about 240 mL,
wherein a ratio of the combined volume of the trenches to the volume of the plenum is in the range of about 10% to about 30%.

2. The outer distribution ring of claim 1, wherein the plenum has a volume in the range of about 400 mL to about 600 mL.

3. The outer distribution ring of claim 2, wherein the trenches have a combined volume in the range of about 40 mL to about 180 mL.

4. The outer distribution ring of claim 1, further comprising a second plenum in fluid communication with the plenum through a plurality of apertures.

5. The outer distribution ring of claim 1, wherein the inner diameter face is shaped so that a gas flowing down the inner diameter face from the plurality of trenches flows substantially concentric with an axis of the body.

6. The outer distribution ring of claim 1, further comprising a gas inlet in fluid communication with the plenum.

7. The outer distribution ring of claim 6, wherein the gas inlet connects to the plenum through the top of the body.

8. The outer distribution ring of claim 6, wherein the gas inlet connects to the plenum through the outer diameter face of the body.

* * * * *